United States Patent
Song et al.

(10) Patent No.: US 9,466,703 B2
(45) Date of Patent: Oct. 11, 2016

(54) METHOD FOR FABRICATING SEMICONDUCTOR DEVICE

(71) Applicant: Samsung Electronics Co., Ltd., Suwon-si (KR)

(72) Inventors: Seung-Hyun Song, Hwaseong-si (KR); Nak-Jin Son, Suwon-si (KR); Kwang-Seok Lee, Osan-si (KR); Chang-Wook Jeong, Hwaseong-si (KR); Ui-Hui Kwon, Hwaseong-si (KR); Dong-Won Kim, Seongnam-si (KR); Young-Kwan Park, Incheon (KR); Keun-Ho Lee, Seongnam-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/587,411

(22) Filed: Dec. 31, 2014

(65) Prior Publication Data

US 2015/0349094 A1 Dec. 3, 2015

(30) Foreign Application Priority Data

May 27, 2014 (KR) ........................ 10-2014-0063746

(51) Int. Cl.
*H01L 29/66* (2006.01)
*H01L 21/265* (2006.01)
*H01L 21/8238* (2006.01)
*H01L 21/8234* (2006.01)

(52) U.S. Cl.
CPC ... *H01L 29/66803* (2013.01); *H01L 21/26586* (2013.01); *H01L 21/823814* (2013.01); *H01L 21/823821* (2013.01); *H01L 29/6681* (2013.01); *H01L 21/823418* (2013.01); *H01L 21/823431* (2013.01)

(58) Field of Classification Search
None
See application file for complete search history.

(56) References Cited

U.S. PATENT DOCUMENTS

| 4,597,824 A | 7/1986 | Shinada et al. |
| 4,703,551 A | 11/1987 | Szluk et al. |
| 7,224,029 B2 | 5/2007 | Anderson et al. |
| 8,252,651 B2 | 8/2012 | Kawasaki |
| 8,278,179 B2 | 10/2012 | Lin et al. |

(Continued)

*Primary Examiner* — Khaja Ahmad
(74) *Attorney, Agent, or Firm* — Muir Patent Law, PLLC

(57) ABSTRACT

Provided are a method for fabricating a semiconductor device The method for fabricating include providing a substrate including a first region and a second region, the first region including first and second sub-regions, and the second region including third and fourth sub-regions, forming first to fourth fins on the first and second regions to protrude from the substrate, the first fin being formed on the first sub-region, the second fin being formed on the second sub-region, the third fin being formed on the third sub-region, and the fourth fin being formed on the fourth sub-region, forming first to fourth dummy gate structures to intersect the first to fourth fins, the first dummy gate structure being formed on the first fin, the second dummy gate structure being formed on the second fin, the third dummy gate structure being formed on the third fin, and the fourth dummy gate structure being formed on the fourth fin, forming a first doped region in each of the first and second fins and a second doped region in each of the third and fourth fins by doping impurities into the first to fourth fins on both sides of the first to fourth dummy gate structures by performing an ion implantation process simultaneously in the first and second regions; and removing the first doped region of the first fin and the second doped region of the third fin, or removing the first doped region of the second fin and the second doped region of the fourth fin.

20 Claims, 31 Drawing Sheets

(56) References Cited

U.S. PATENT DOCUMENTS

| | | |
|---|---|---|
| 8,367,485 B2 | 2/2013 | Chang et al. |
| 8,536,658 B2 | 9/2013 | Wu et al. |
| 8,557,692 B2 | 10/2013 | Tsai et al. |
| 2007/0284583 A1 | 12/2007 | Saito |
| 2010/0252866 A1* | 10/2010 | Peidous ............ H01L 21/26506 257/255 |
| 2011/0068407 A1* | 3/2011 | Yeh ................. H01L 21/823807 257/369 |
| 2011/0147842 A1* | 6/2011 | Cappellani ........ H01L 21/26506 257/365 |
| 2011/0171795 A1* | 7/2011 | Tsai ................. H01L 21/26513 438/232 |
| 2013/0078772 A1 | 3/2013 | Yuan et al. |
| 2013/0280876 A1 | 10/2013 | Tsai et al. |

* cited by examiner

METHOD FOR FABRICATING SEMICONDUCTOR DEVICE

CROSS-REFERENCE TO RELATED APPLICATION

This application claims priority from Korean Patent Application No. 10-2014-0063746 filed on May 27, 2014 in the Korean Intellectual Property Office, and all the benefits accruing therefrom under 35 U.S.C. 119, the contents of which in its entirety are herein incorporated by reference.

BACKGROUND

1. Field of the Invention

The present inventive concept relates to a method for fabricating a semiconductor device.

2. Description of the Related Art

As one of scaling techniques for increasing the density of an integrated circuit device, there has been proposed a multi-gate transistor in which a silicon body having a fin shape or nanowire shape is formed on a substrate and a gate is formed on the surface of the silicon body.

In such a multi-gate transistor, since a three-dimensional channel is used, scaling is relatively easy. Further, although the gate length of the multi-gate transistor is not increased, the current controllability can be improved. In addition, it is possible to effectively suppress a short channel effect (SCE) in which the potential of a channel region is affected by a drain voltage.

However, since a multi-gate transistor has a structure in which a three-dimensional channel is formed in a small area, in certain situations, ion implantation is not easy. For example, if a general ion implantation process is applied to form the three-dimensional channel, a three-dimensional channel may not be formed because the ion implantation is not performed uniformly.

SUMMARY

Aspects of the present inventive concept provide a method for fabricating a semiconductor device capable of forming a three-dimensional channel by uniform ion implantation.

Aspects of the present inventive concept also provide a method for fabricating a semiconductor device capable of forming a transistor having various threshold voltages through one ion implantation process.

These and other objects of the present inventive concept will be described in or be apparent from the following description of the various embodiments.

According to an aspect of the present inventive concept, there is provided a method for fabricating a semiconductor device including providing a substrate including a first region and a second region, the first region including first and second sub-regions, and the second region including third and fourth sub-regions, forming first to fourth fins on the first and second regions to protrude from the substrate, the first fin being formed on the first sub-region, the second fin being formed on the second sub-region, the third fin being formed on the third sub-region, and the fourth fin being formed on the fourth sub-region, forming first to fourth dummy gate structures to intersect the first to fourth fins, the first dummy gate structure being formed on the first fin, the second dummy gate structure being formed on the second fin, the third dummy gate structure being formed on the third fin, and the fourth dummy gate structure being formed on the fourth fin, forming a first doped region in each of the first and second fins and a second doped region in each of the third and fourth fins by doping impurities into the first to fourth fins on both sides of the first to fourth dummy gate structures by performing an ion implantation process simultaneously in the first and second regions; and removing the first doped region of the first fin and the second doped region of the third fin, or removing the first doped region of the second fin and the second doped region of the fourth fin.

According to another aspect of the present inventive concept, there is provided a method for fabricating a semiconductor device, including providing a substrate including an NMOS region and a PMOS region, forming first and second fins on the NMOS region and the PMOS region to protrude from the substrate, forming a first doped region in the first fin and a second doped region in the second fin by doping impurities into the first and second fins simultaneously by an angled ion implantation process, and removing the first doped region or the second doped region, and forming source/drain regions in the removed portion by epitaxial growth.

However, aspects of the present inventive concept are not restricted to the one set forth herein. The above and other aspects of the present inventive concept will become more apparent to one of ordinary skill in the art to which the present inventive concept pertains by referencing the detailed description given below.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF THE EMBODIMENTS

Figure 1:
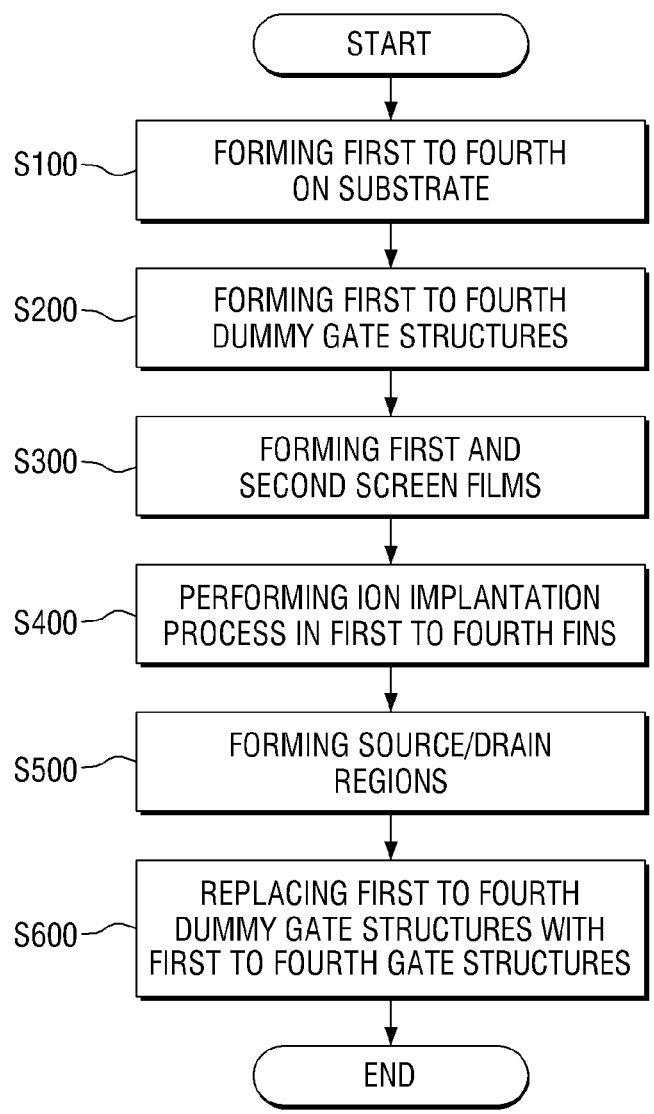
FIG. 1 is a flowchart of a method for fabricating a semiconductor device according to an embodiment of the present inventive concept.

Advantages and features of the present inventive concept and methods of accomplishing the same may be understood more readily by reference to the following detailed description of various embodiments and the accompanying drawings. The present inventive concept may, however, be embodied in many different forms and should not be construed as being limited to the embodiments set forth herein. Like reference numerals refer to like elements throughout the specification.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, or as contacting another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present inventive concept.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

A method for fabricating a semiconductor device according to an embodiment of the present inventive concept will be described with reference to FIGS. 1 to 23.

FIG. 1 is a flowchart of a method for fabricating a semiconductor device according to an embodiment of the present inventive concept. FIGS. 2 to 23 are diagrams showing intermediate steps of a method for fabricating a semiconductor device according to an embodiment of the present inventive concept.

Figure 2:
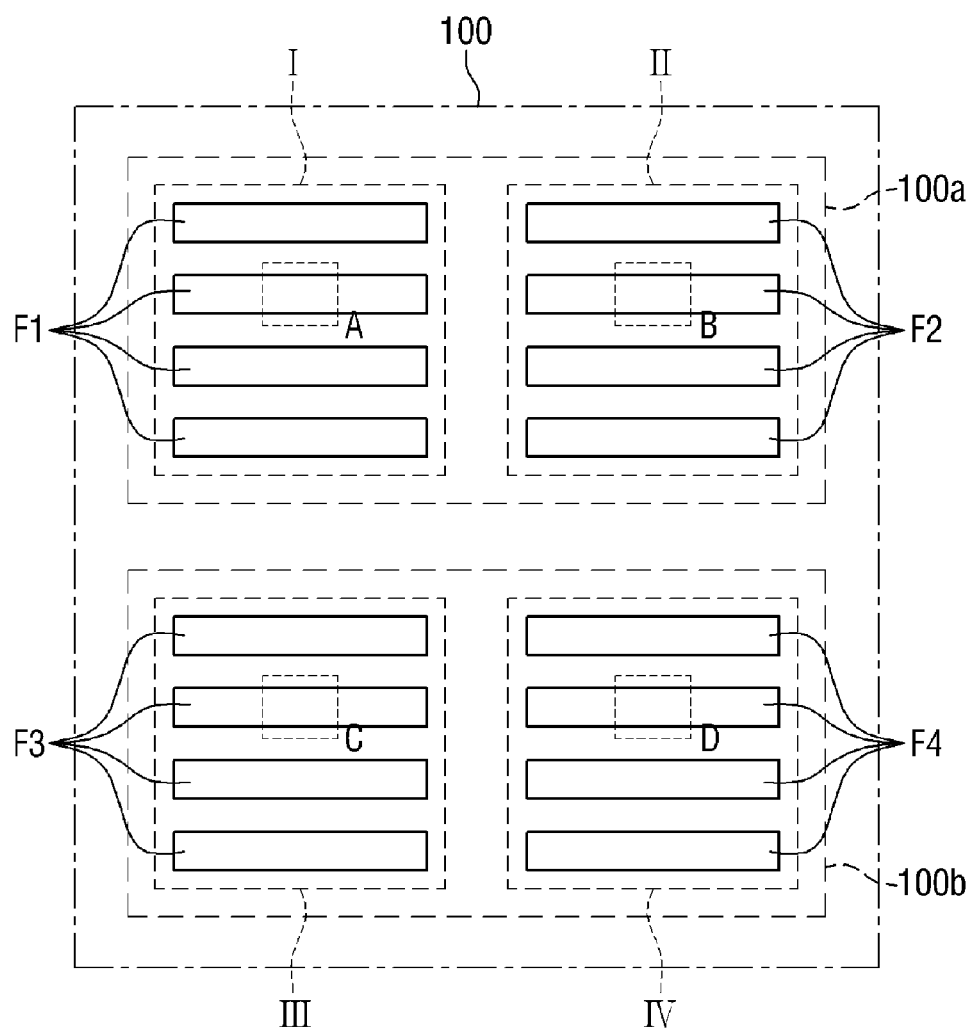
FIGS. 2 to 23 are diagrams showing intermediate steps of a method for fabricating a semiconductor device according to an embodiment of the present inventive concept.
Figure 4:
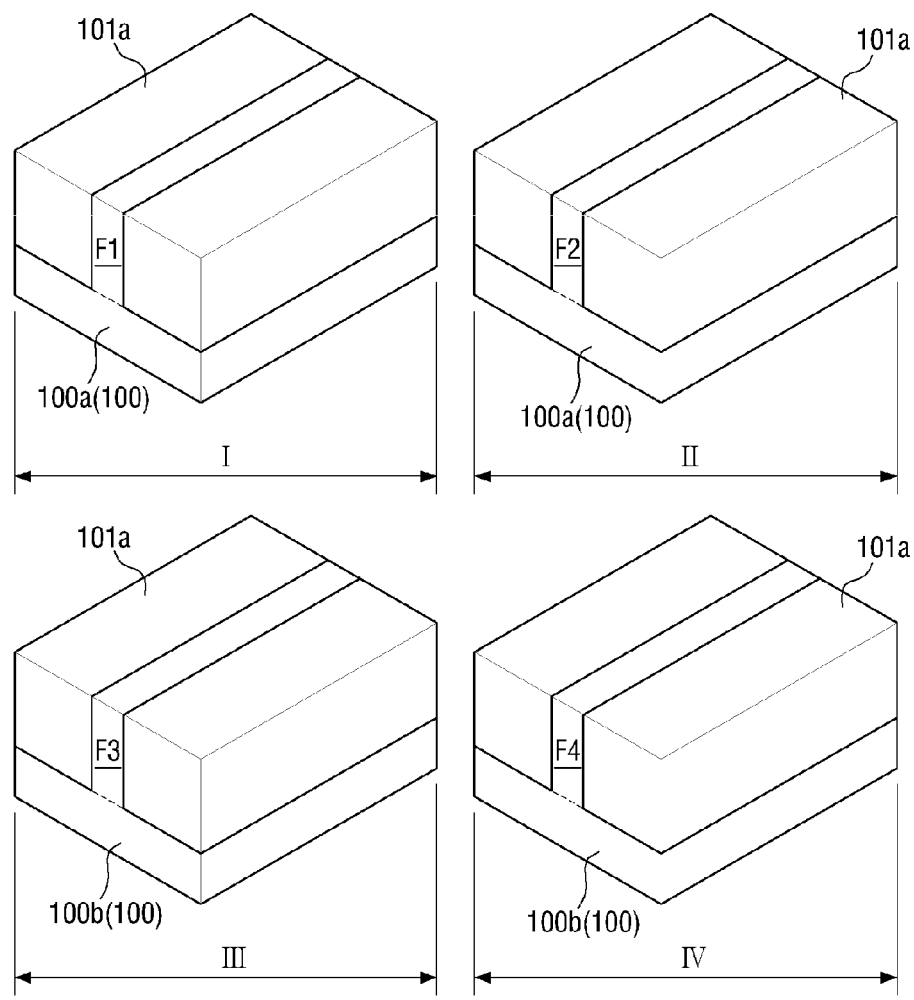
Figure 5:
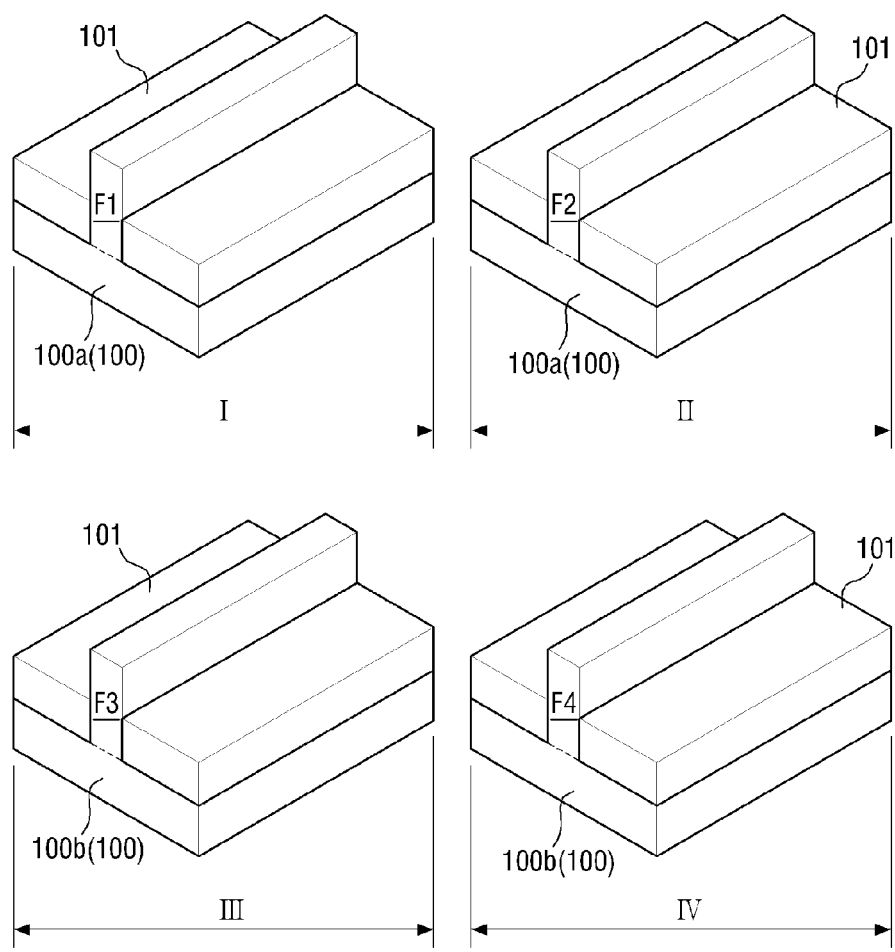
Figure 6:
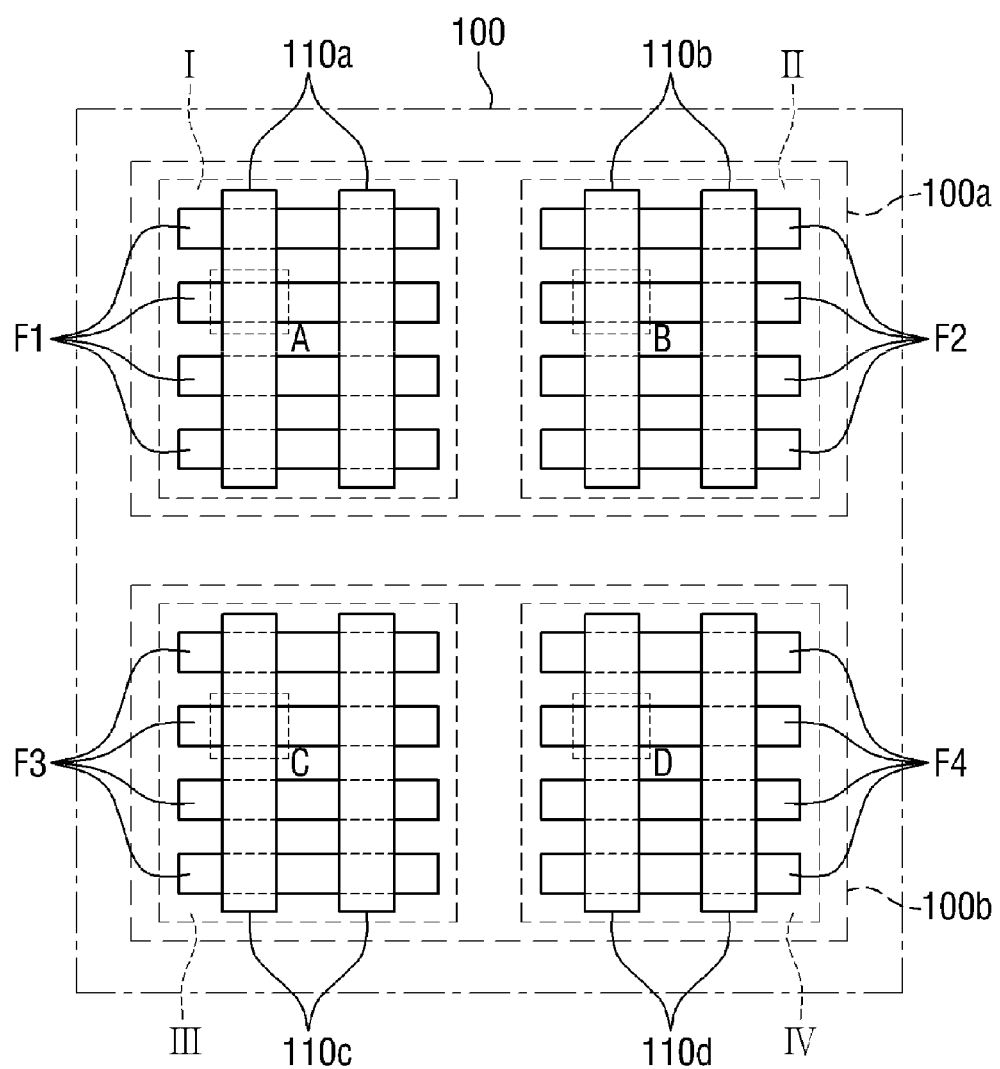
Figure 7:
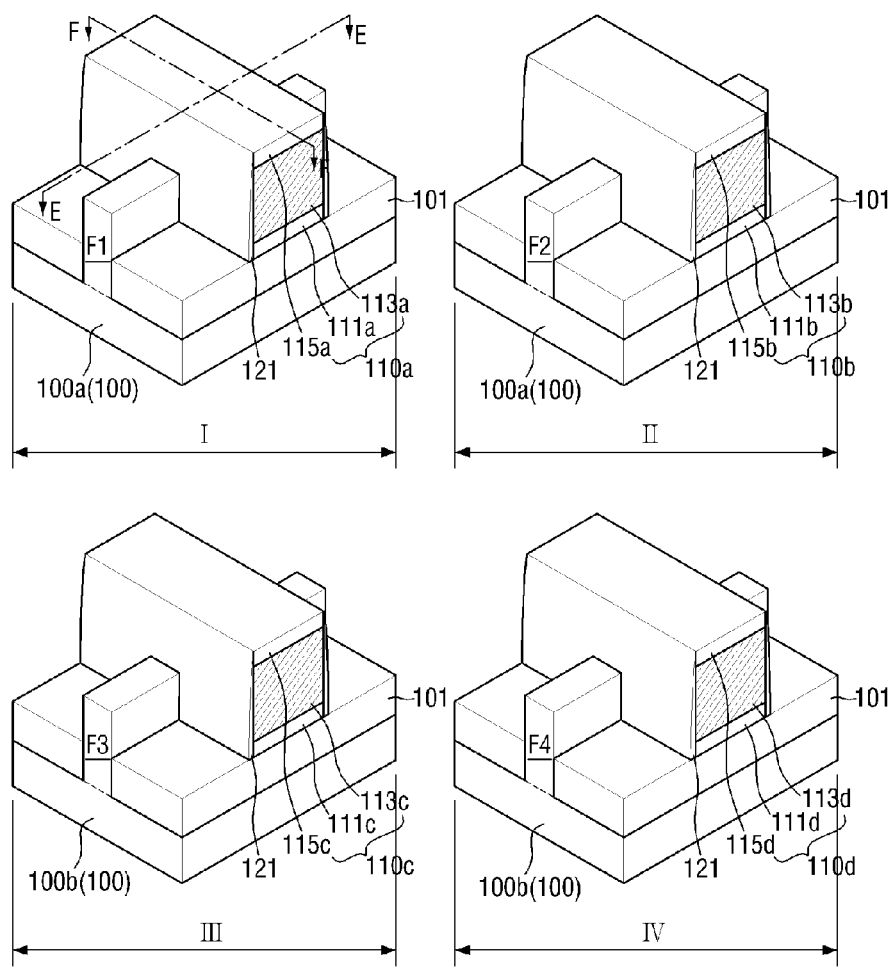
Figure 8:
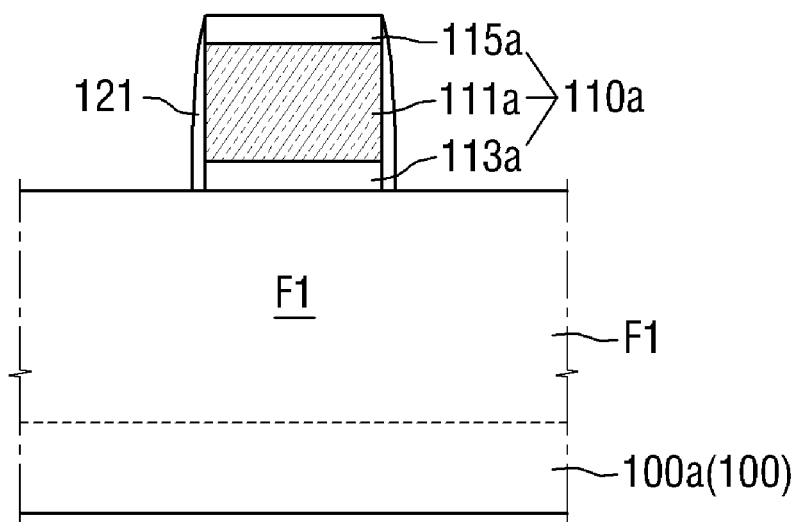
Figure 9:
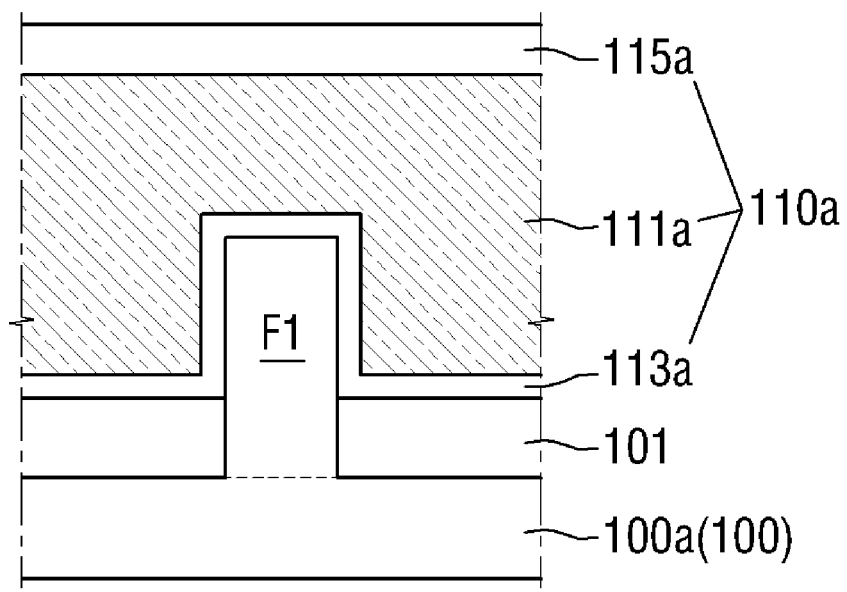
Figure 10:
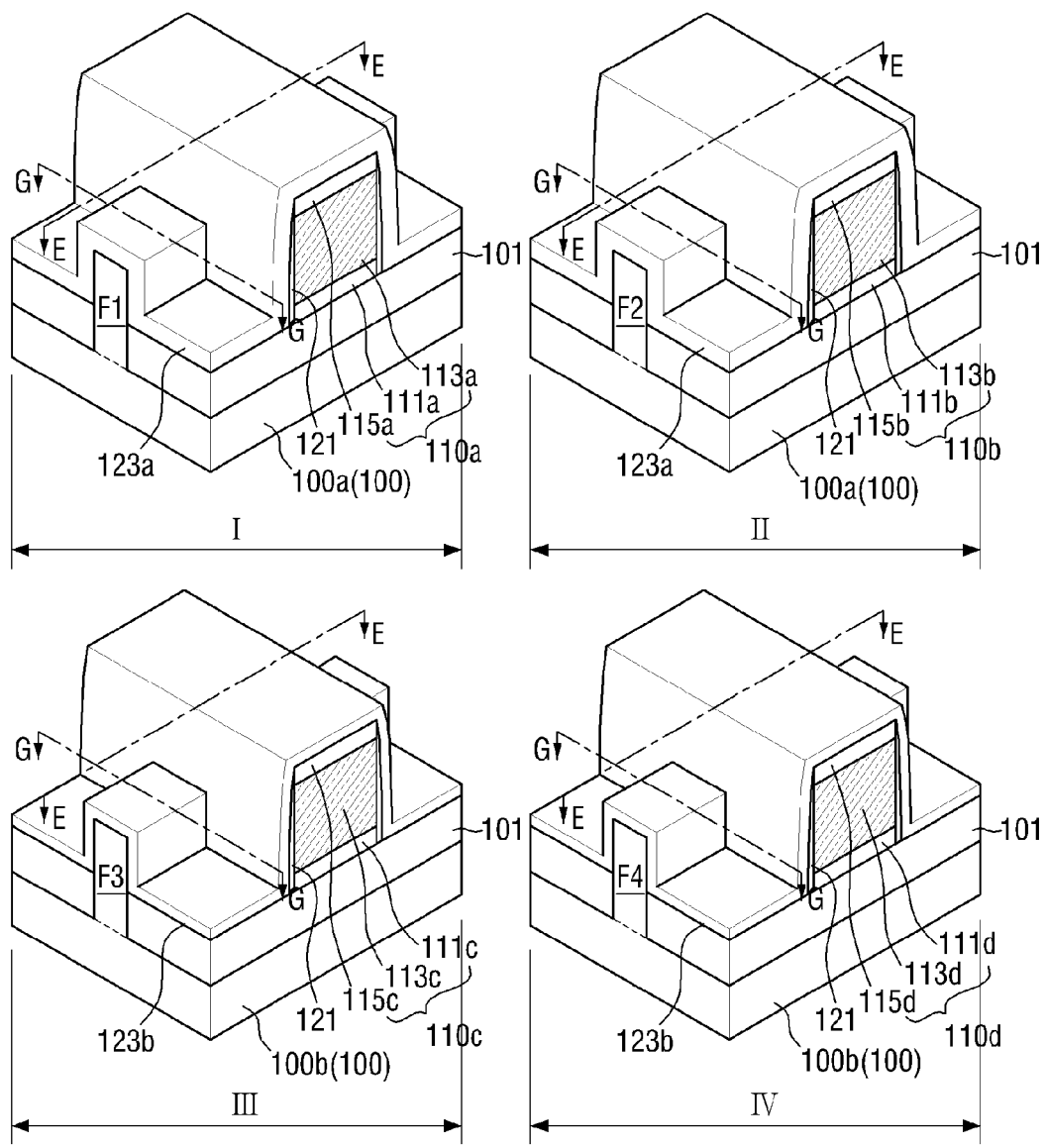
Figure 11:
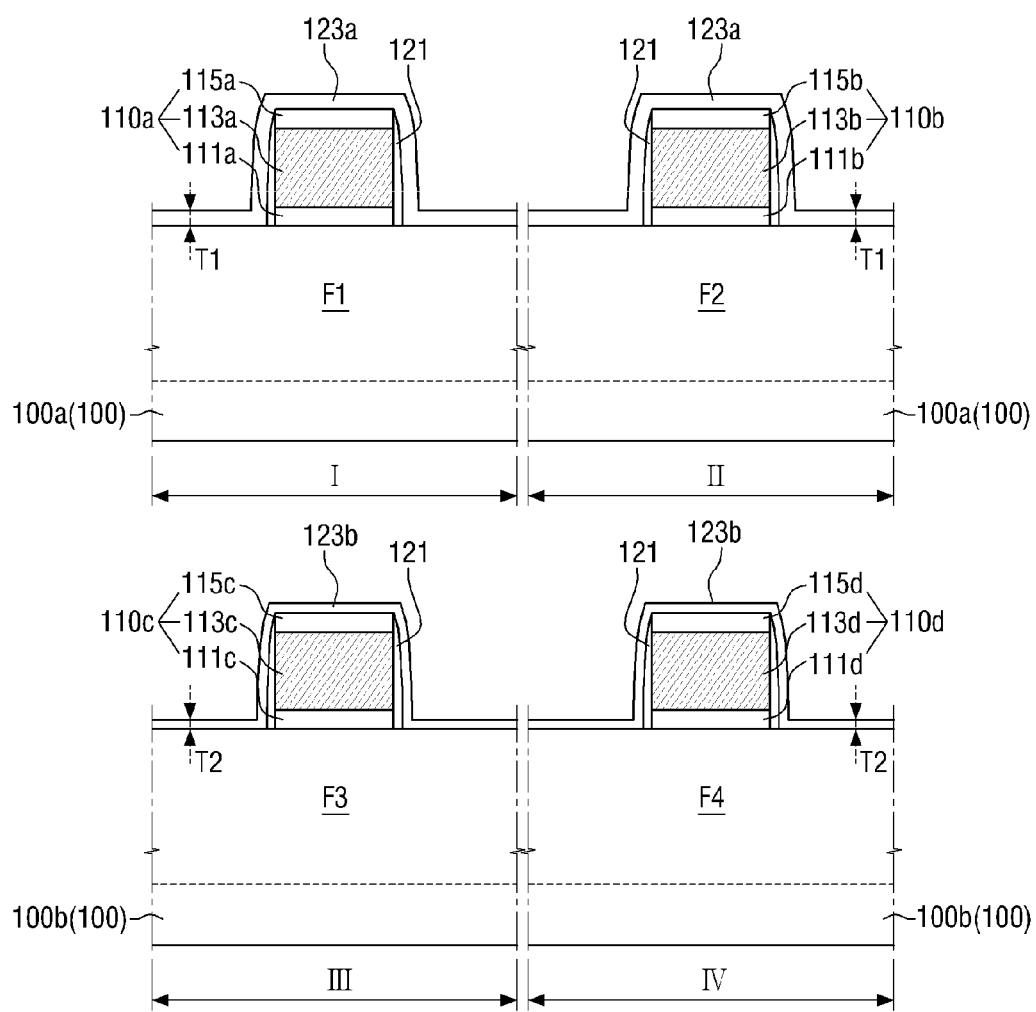
Figure 12:
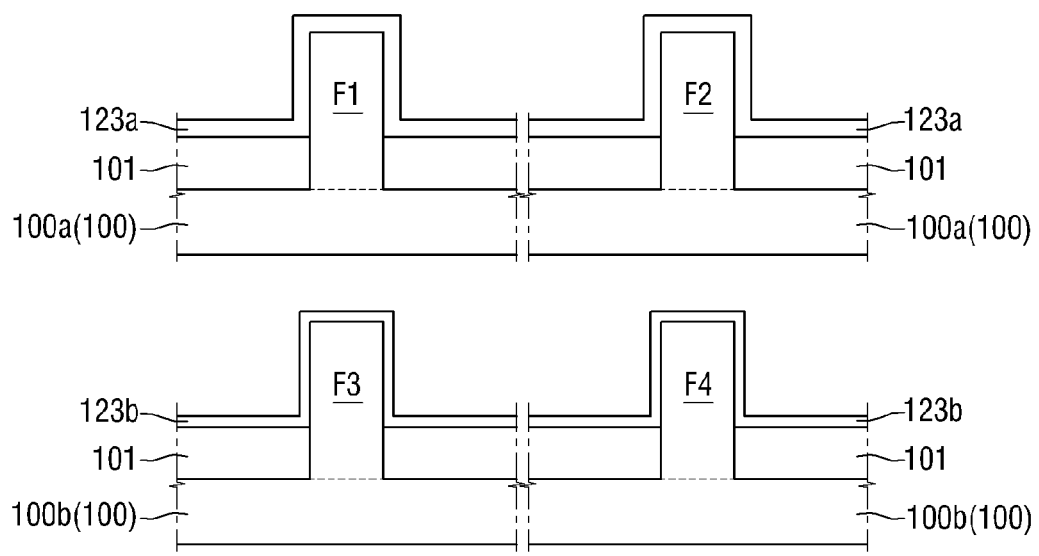
Figure 13:
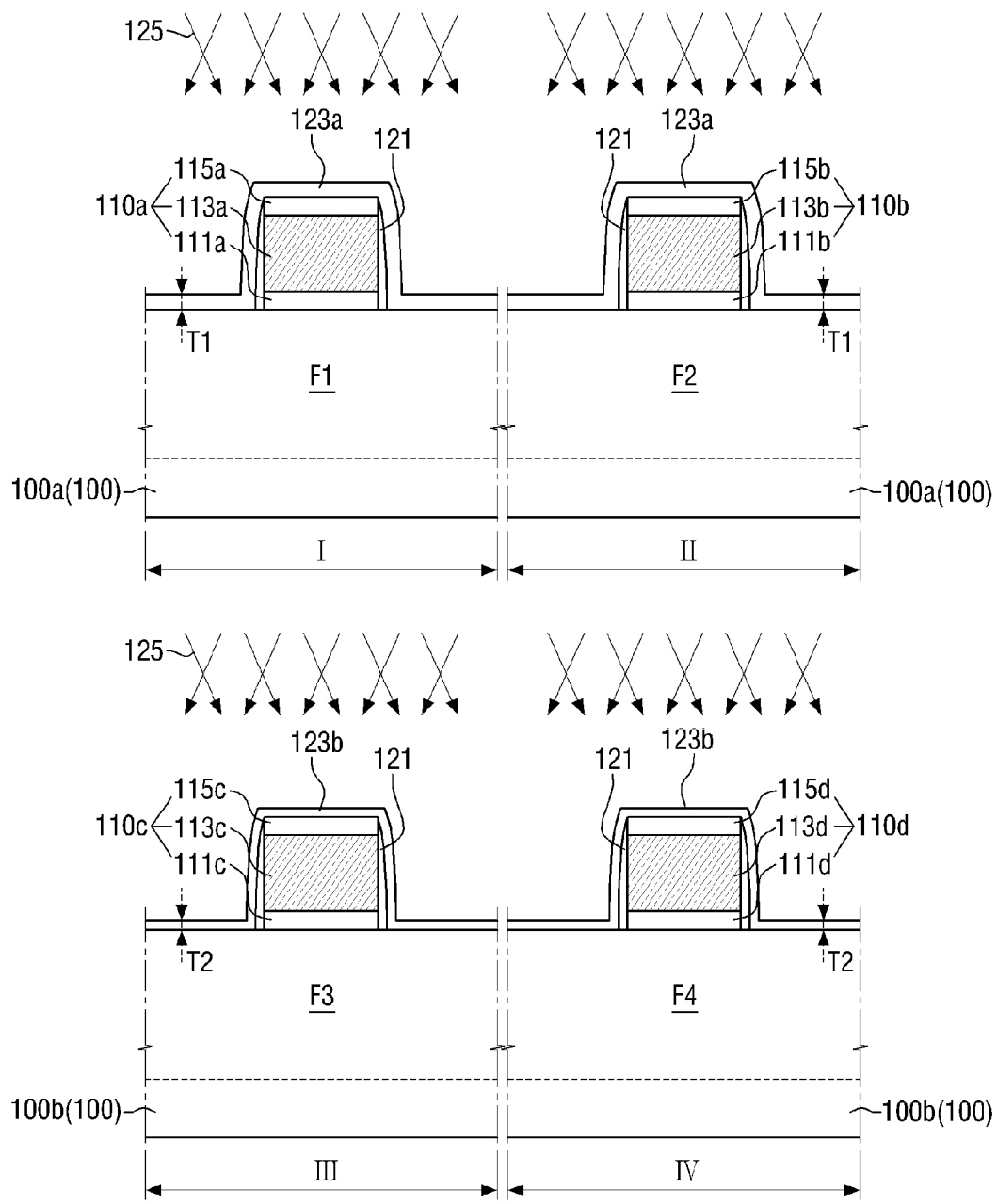
Figure 17:
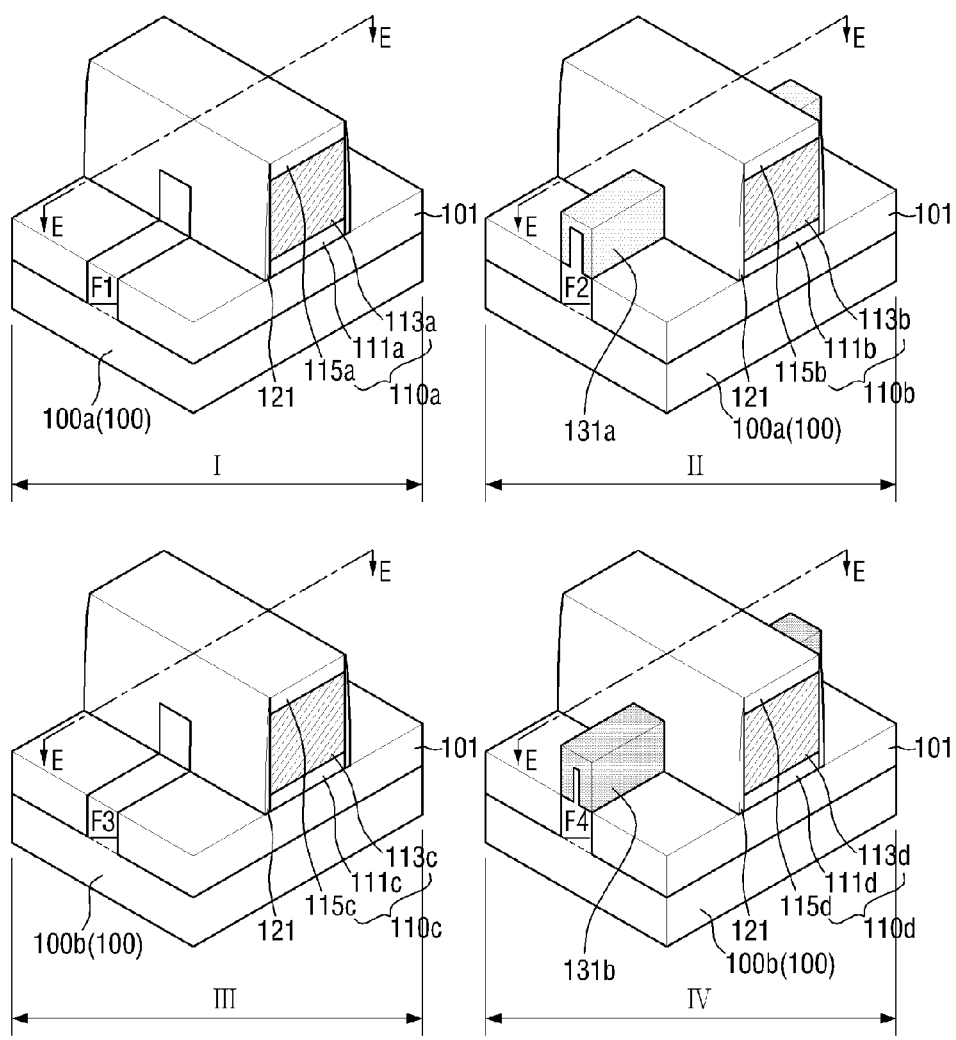
Figure 18:
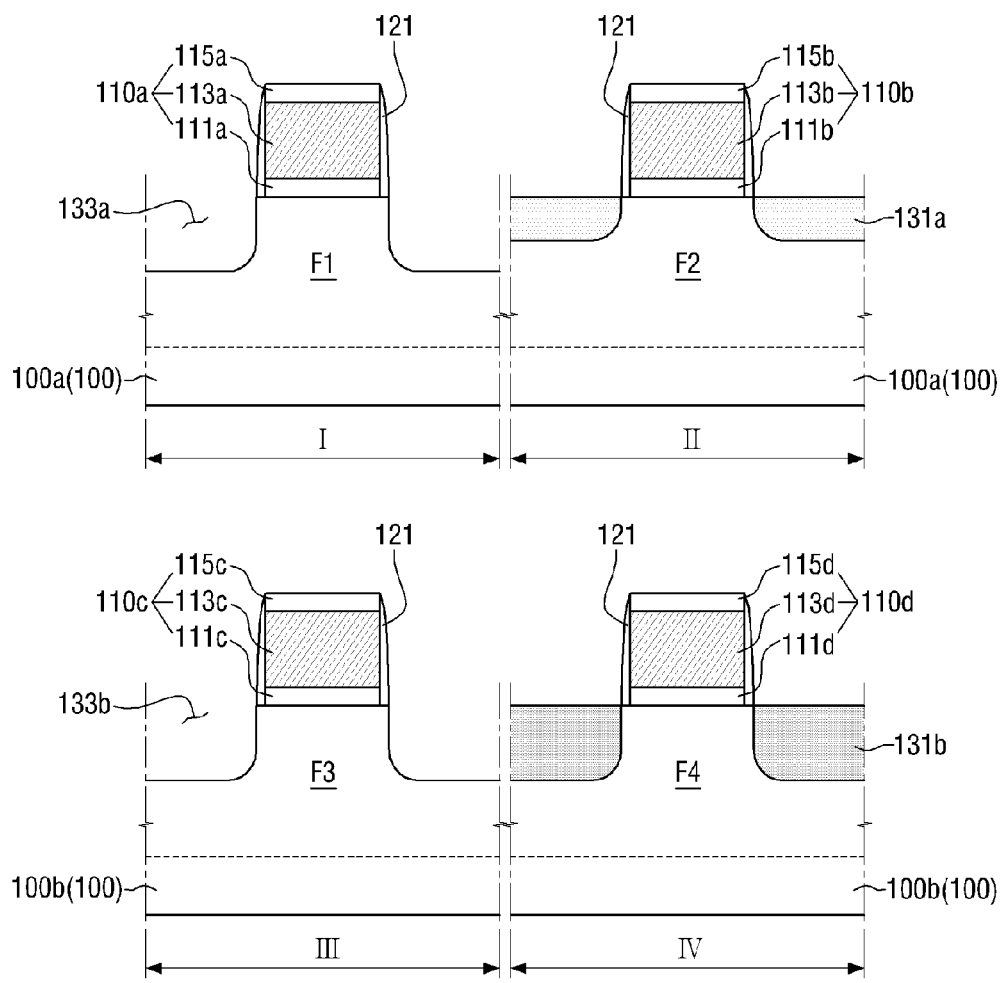
Figure 20:
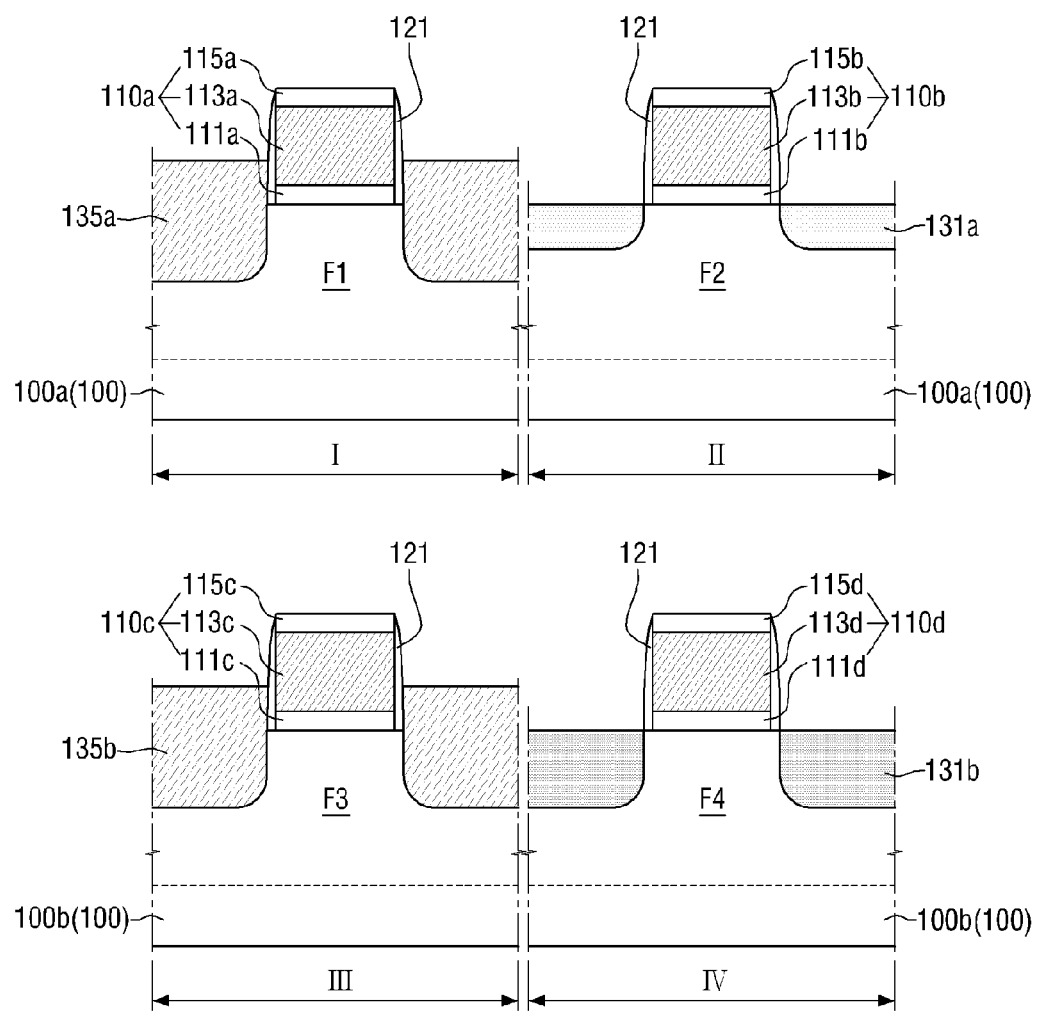
Figure 21:
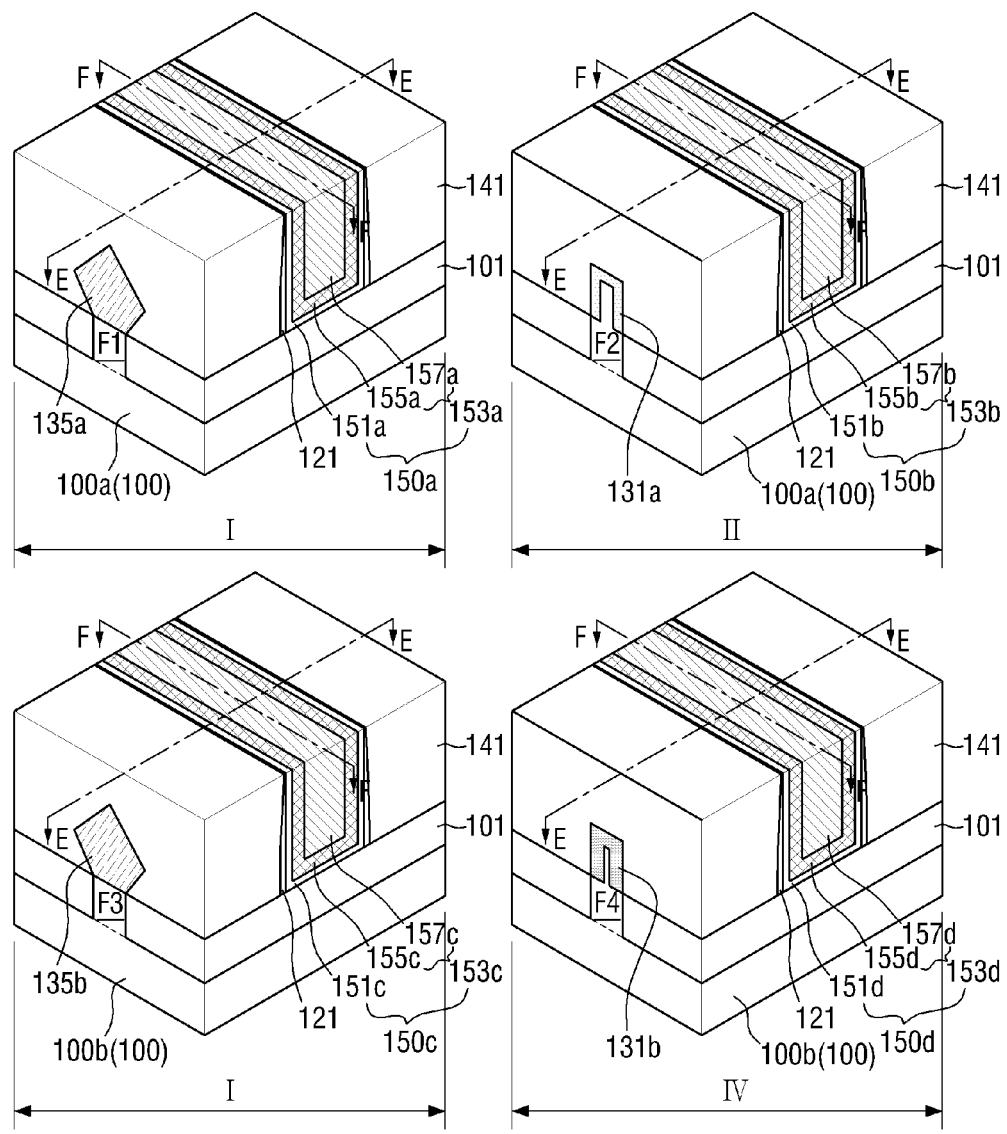
Figure 22:
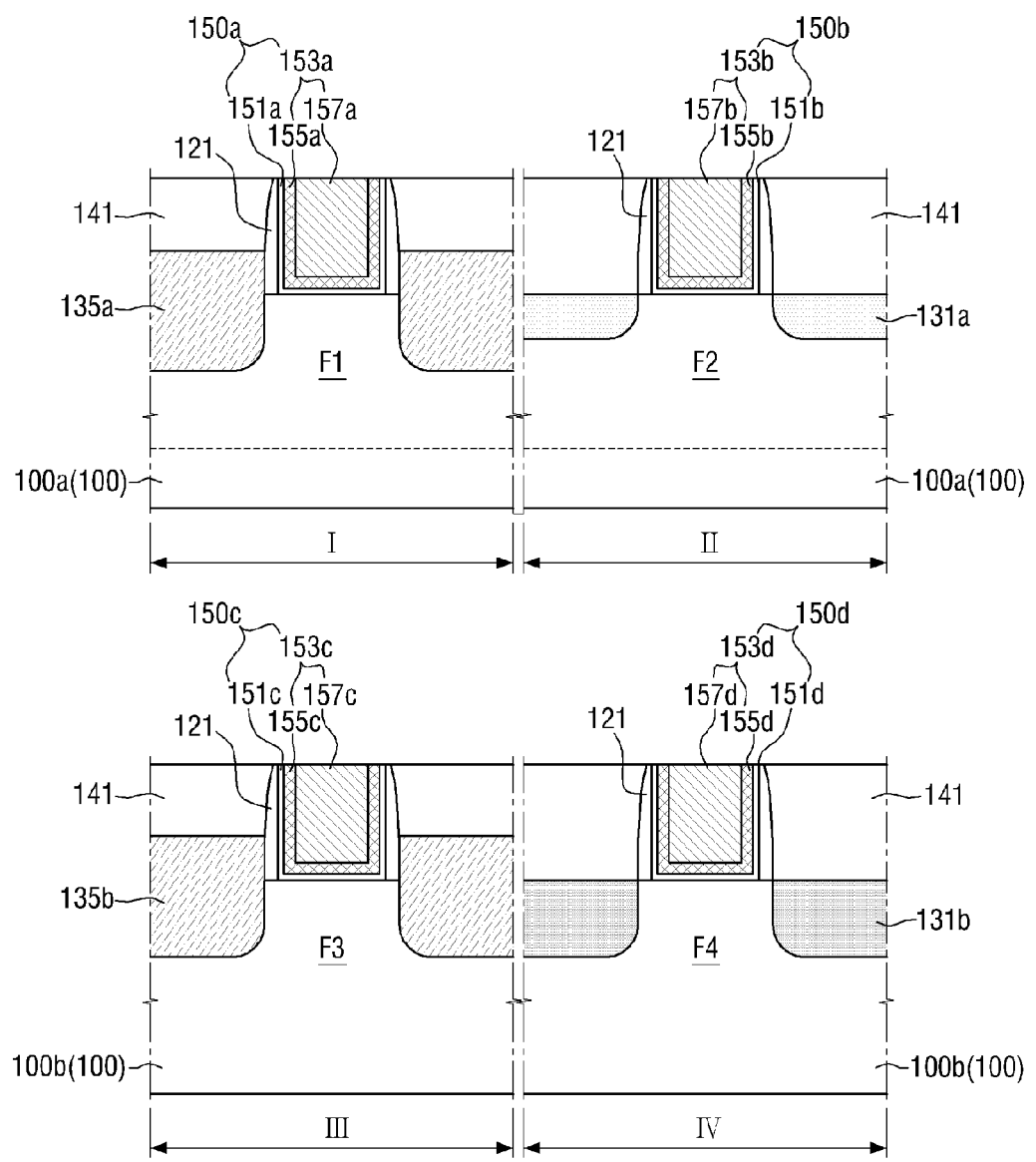
Figure 23:
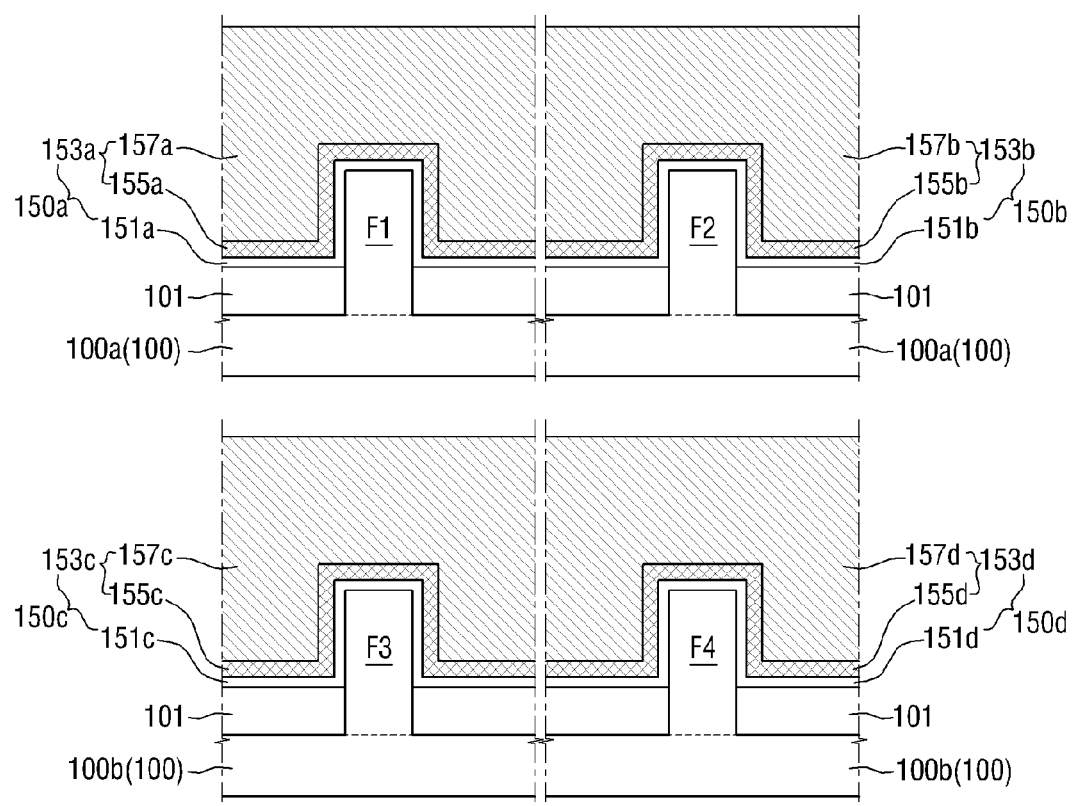

Specifically, FIGS. 2 and 6 are plan views, and FIGS. 3 to 5, 7, 10, 17, 19 and 21 are perspective views of region A, region B, region C and region D of FIGS. 2 and 6. FIG. 8 is a cross-sectional view taken along line E-E of FIG. 7, and FIG. 9 is a cross-sectional view taken along line F-F of FIG. 7. FIGS. 11, 13 and 15 are cross-sectional views taken along line E-E of FIG. 10, and FIGS. 12, 14 and 16 are cross-sectional views taken along line G-G of FIG. 10. FIG. 18 is a cross-sectional view taken along line E-E of FIG. 17, and FIG. 20 is a cross-sectional view taken along line E-E of FIG. 19. FIG. 22 is a cross-sectional view taken along line E-E of FIG. 21, and FIG. 23 is a cross-sectional view taken along line F-F of FIG. 21.

Referring to FIGS. 1 and 2 to 4, first to fourth fins F1, F2, F3 and F4 may be formed on a substrate 100 (step S100).

The substrate 100 includes a first region 100a and a second region 100b. The threshold voltages of a transistor formed in the first region 100a and a transistor formed in the second region 100b may be different from each other, which will be described later.

The first region 100a includes a first sub-region I and a second sub-region II. The second region 100b includes a third sub-region III and a fourth sub-region IV. The first sub-region I and the second sub-region II may be spaced from each other as shown in FIG. 2, or may be connected to each other (e.g., connected with no space therebetween). The third sub-region III and the fourth sub-region IV may be spaced from each other as shown in FIG. 2, or may be connected to each other.

In one embodiment, the first sub-region I and the third sub-region III may be PMOS regions, and the second sub-region II and the fourth sub-region IV may be NMOS regions.

The substrate 100 may be made of a semiconductor material including, for example, at least one of Si, Ge, SiGe, GaP, GaAs, SiC, SiGeC, InAs, and InP. Alternatively, a silicon on insulator (SOI) substrate may be used.

A plurality of fins may be formed on the substrate 100. Specifically, a first fin F1 (four first fins F1 are shown in FIG. 2) may be formed on the first sub-region I, a second fin F2 (four second fins F2 are shown in FIG. 2) may be formed on the second sub-region II, a (four second fins F2 are shown in FIG. 2) may be formed on the second sub-region II, a third fin F3 (four third fins F3 are shown in FIG. 2) may be formed on the third sub-region III, and a fourth fin F4 (four fourth fins F4 are shown in FIG. 2) may be formed on the fourth sub-region IV. Each of the first to fourth fins F1, F2, F3 and F4 may be formed as a single fin or may be one of a plurality of fins that form a fin structure, such as shown in FIG. 2.

FIG. 2 illustrates a case where the first to fourth fins F1, F2, F3 and F4 are formed in parallel to each other, but the present inventive concept is not limited thereto.

Figure 3:
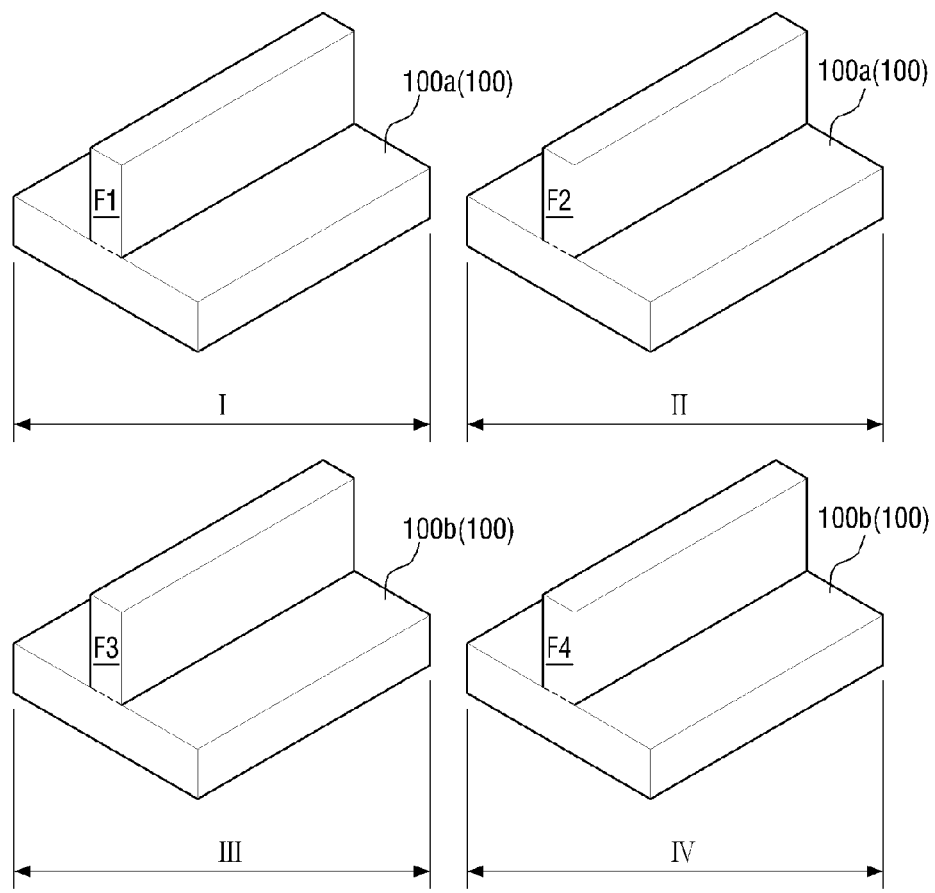

Referring to FIGS. 2 and 3, the first to fourth fins F1, F2, F3 and F4 may be formed to protrude from the substrate 100. Each of the first to fourth fins F1, F2, F3 and F4 may have a long side and a short side.

The first to fourth fins F1, F2, F3 and F4 may be a part of the substrate 100, and may include an epitaxial layer grown from the substrate 100. The first to fourth fins F1, F2, F3 and F4 may include, for example, Si, SiGe or the like.

Referring to FIG. 4, a field insulating film 101a may be formed on the substrate 100. The field insulating film 101a may be formed to cover the sidewalls of the first to fourth fins F1, F2, F3 and F4.

The field insulating film 101a may be formed of a material including, for example, at least one of a silicon oxide film, a silicon nitride film, and a silicon oxynitride film.

Referring to FIG. 5, a field isolation film 101 may be formed to expose upper portions of the first to fourth fins F1, F2, F3 and F4 by recessing an upper portion of the field insulating film 101a. A recess process may include, for example, a selective etching process.

The field isolation film 101 may cover the substrate 100 and the sidewalls of lower portions of the first to fourth fins F1, F2, F3 and F4.

Referring to FIGS. 1 and 6 to 9, first to fourth dummy gate structures 110a, 110b, 110c and 110d may be formed to intersect the first to fourth fins F1, F2, F3 and F4, respectively (step S200).

The first dummy gate structure 110a may be disposed on the first fin F1 to intersect the first fin F1, and the second dummy gate structure 110b may be disposed on the second fin F2 to intersect the second fin F2. The third dummy gate structure 110c may be disposed on the third fin F3 to intersect the third fin F3, and the fourth dummy gate structure 110d may be disposed on the fourth fin F4 to intersect the fourth fin F4. Each of the first to fourth dummy gate structures 110a, 110b, 110c and 110d may include a plurality of dummy gate structures.

The figures illustrate a case where the first to fourth dummy gate structures 110a, 110b, 110c and 110d intersect the first to fourth fins F1, F2, F3 and F4 at right angles, but the present inventive concept is not limited thereto. The first to fourth dummy gate structures 110a, 110b, 110c and 110d may intersect the first to fourth fins F1, F2, F3 and F4 at acute and/or obtuse angles.

The first to fourth dummy gate structures 110a, 110b, 110c and 110d may include first to fourth dummy insulating films 111a, 111b, 111c and 111d, first to fourth dummy gate electrodes 113a, 113b, 113c and 113d, and first to fourth hard masks 115a, 115b, 115c and 115d.

In one embodiment, since the second to fourth dummy gate structures 110b, 110c and 110d have the same structure as the first dummy gate structure 110a, cross-sectional views of only the first dummy gate structure 110a is illustrated in FIGS. 8 and 9.

The first dummy gate structure 110a may be formed by sequentially stacking the first dummy insulating film 111a, the first dummy gate electrode 113a and the first hard mask 115a.

The first dummy insulating film 111a may be formed conformally on the upper and side surfaces of the first fin F1. Meanwhile, the first dummy insulating film 111a may be disposed between the first dummy gate electrode 113a and the field isolation film 101. The first dummy insulating film 111a may include, for example, a silicon oxide film, or the like.

The first dummy gate electrode 113a may be formed on the first dummy insulating film 111a. The first dummy gate electrode 113a may include polysilicon or amorphous silicon.

The first hard mask 115a may be formed on the first dummy gate electrode 113a. The first hard mask 115a may be formed of a material including, for example, at least one of a silicon oxide film, a silicon nitride film, and a silicon oxynitride film.

Spacers 121 may be formed respectively on the sidewalls of the first to fourth dummy gate structures 110a, 110b, 110c and 110d. The spacers 121 may protect the sidewalls of the first to fourth dummy gate structures 110a, 110b, 110c and 110d. The spacers 121 may include, for example, a silicon nitride film or silicon oxynitride film. Each of the first to fourth dummy gate structures 110a, 110b, 110c, and 110d may be formed as a single dummy gate or may be one of a plurality of dummy gates that form the dummy gate structure, such as shown in FIG. 6.

Referring to FIGS. 1 and 10 to 12, first and second screen films 123a and 123b may be formed (step S300).

The first screen film 123a may be formed on the first region 100a, and the second screen film 123b may be formed on the second region 100b.

The first screen film 123a may cover the first fin F1 and the second fin F2, and the second screen film 123b may cover the third fin F3 and the fourth fin F4. Specifically, the first screen film 123a may cover the upper surface and the sidewall of the first fin F1 exposed on both sides of the first dummy gate structure 110a. Further, the first screen film 123a may cover the upper surface and the sidewall of the second fin F2 exposed on both sides of the second dummy gate structure 110b.

The second screen film 123b may cover the upper surface and the sidewall of the third fin F3 exposed on both sides of the third dummy gate structure 110c. Further, the second screen film 123b may cover the upper surface and the sidewall of the fourth fin F4 exposed on both sides of the fourth dummy gate structure 110d.

The first screen film 123a may have a first thickness T1, and the second screen film 123b may have a second thickness T2. The first thickness T1 and the second thickness T2 may be different from each other. The first thickness T1 may be larger than the second thickness T2.

Meanwhile, the figures illustrate a case where the first and second screen films 123a and 123b also cover the first to fourth dummy gate structures 110a, 110b, 110c and 110d and the field isolation film 101, but the present inventive concept is not limited thereto. For example, the first and second screen films 123a and 123b may cover only the first to fourth fins F1, F2, F3 and F4.

The first and second screen films 123a and 123b may serve to adjust the amount of impurities doped when performing an ion implantation process (125 of FIGS. 13 and 14) and reduce the damage to the first to fourth fins F1, F2, F3 and F4 and the first to fourth dummy gate structures 110a, 110b, 110c and 110d due to impurities.

The first and second screen films 123a and 123b may include, for example, a silicon nitride film or silicon oxynitride film.

Figure 14:
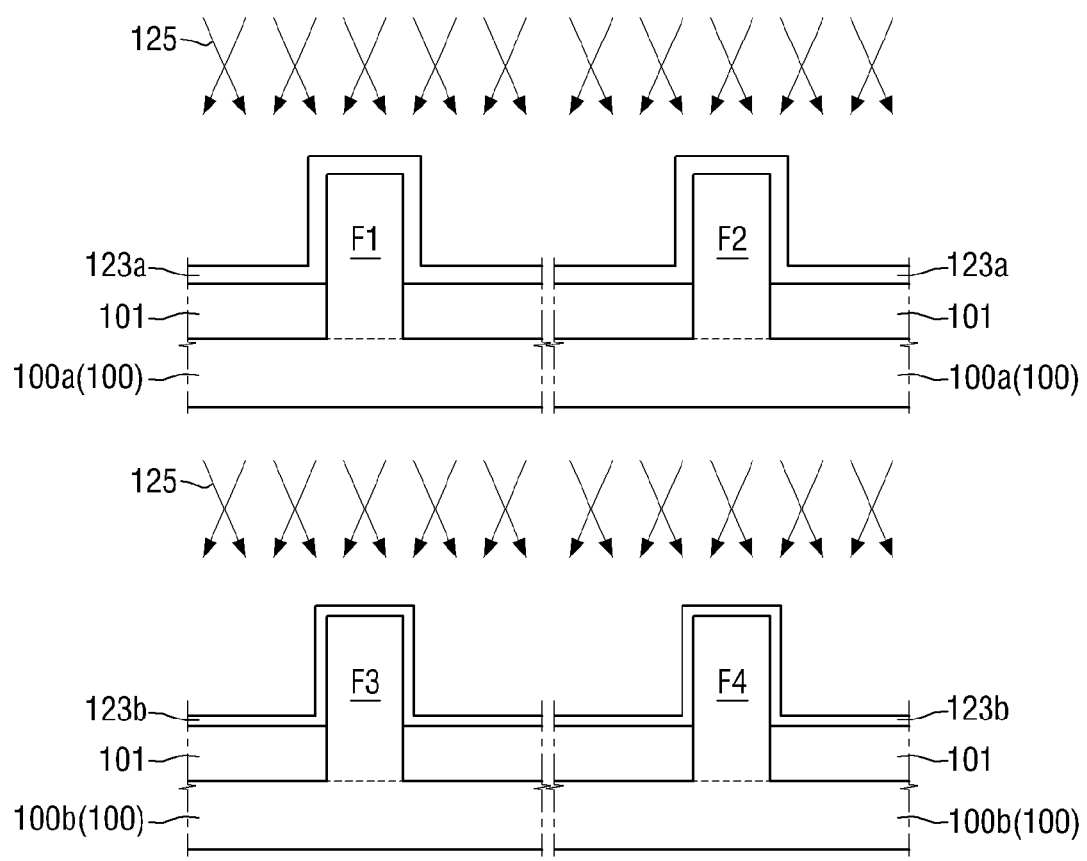
Figure 15:
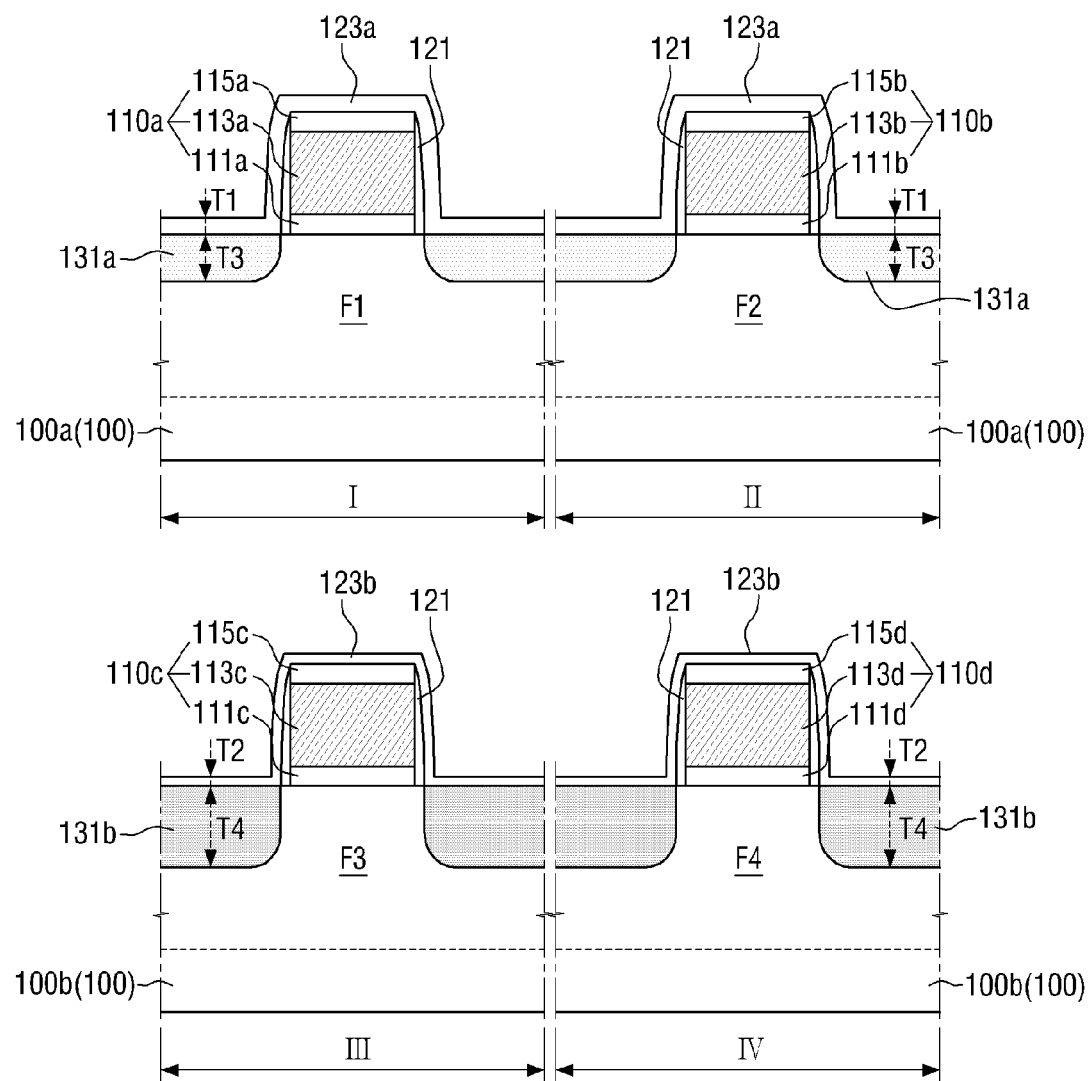
Figure 16:
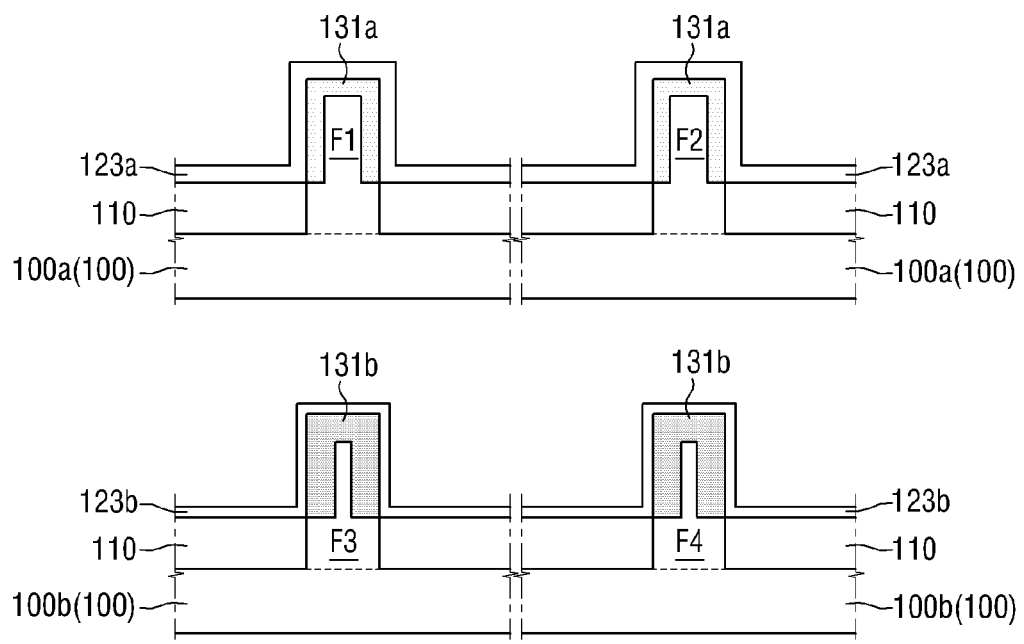

Referring to FIGS. 1, 13 and 14, an ion implantation process may be performed on the first to fourth fins F1, F2, F3 and F4 (step S400).

The ion implantation process 125 may be performed on the substrate 100. The ion implantation process 125 may be performed in the first region 100a and the second region 100b at the same time. Thus, impurities are doped into the first to fourth fins F1, F2, F3 and F4 of the first to fourth sub-region I, II, III and IV at the same time.

The ion implantation process 125 may be an angled ion implantation process. When an angled ion implantation process is performed, impurities may be uniformly doped into the first to fourth fins F1, F2, F3 and F4.

When impurities are doped, the ion implantation process 125 may be performed on the second and fourth sub-regions II and IV while covering a mask (not shown) on the first and third sub-regions I and III. However, in this case, due to the height of the mask (not shown), a scanning angle is limited when performing the ion implantation process 125. Since the ion implantation process 125 is performed at a small scanning angle, impurities cannot be uniformly doped into the second and fourth fins F2 and F4. However, when the ion implantation process 125 is performed on the substrate 100 without covering a mask as in certain embodiments, the ion implantation process 125 may be performed at a large scanning angle, for example, a scanning angle of 15 degrees or more, on the major surface of the substrate 100. Thus, impurities may be uniformly doped into the second and fourth fins F2 and F4. The impurities may be N-type impurities, and for example, the N-type impurities may be arsenic (As) or phosphorus (Ph).

Referring to FIGS. 14 and 15, when the ion implantation process 125 is performed, a first doped region 131a and a second doped region 131b may be formed in the first to fourth fins F1, F2, F3 and F4. The first doped region 131a may be formed in the first and second fins F1 and F2 of the first region 100a, and the second doped region 131b may be formed in the third and fourth fins F3 and F4 of the second region 100b.

The amount of impurities doped into the first doped region 131a may be different from the amount of impurities doped into the second doped region 131b due to a difference in thickness between the first screen film 123a and the second screen film 123b.

Since the thickness T1 of the first screen film 123a is larger than the thickness T2 of the second screen film 123b, the amount of impurities doped into the first and second fins F1 and F2 may be smaller than the amount of impurities doped into the third and fourth fins F3 and F4.

Further, the first doped region 131a and the second doped region 131b may vary in size. For example, a thickness T3 of the first doped region 131a may be smaller than a thickness T4 of the second doped region 131b.

Referring to FIGS. 1 and 17 to 20, source/drain regions may be formed in the first and third fins F1 and F3 (step S500).

First, referring to FIGS. 17 and 18, the first and second screen films 123a and 123b may be removed. Accordingly, the first to fourth fins F1, F2, F3 and F4 on both sides of the first to fourth dummy gate structures 110a, 110b, 110c and 110d may be exposed.

Then, the first and third fins F1 and F3 of the first and third sub-regions I and III may be removed. The exposed portions of the first and third fins F1 and F3, which are not covered by the first and third dummy gate structures 110a and 110c, may be etched.

The first doped region 131a of the first sub-region I and the second doped region 131b of the third sub-region III may be removed. Even if the N-type impurities are doped into the first and third fins F1 and F3, since the first and second doped regions 131a and 131b doped with impurities are removed, the N-type impurities may not affect the performance of transistors formed in the first and third sub-regions I and III.

Meanwhile, the amount of impurities doped into the first and second fins F1 and F2 of the first region 100a is different from the amount of impurities doped into the third and fourth fins F3 and F4 of the second region 100b. Thus, the threshold voltage of a second gate structure 150b (see FIG. 21) formed in the first region 100a may be different from the threshold voltage of a fourth gate structure 150d (see FIG. 21) formed in the second region 100b. For example, since the impurities are N-type impurities and the amount of impurities doped into the second sub-region II is smaller than the amount of impurities doped into the fourth sub-region IV, the threshold voltage of the second gate structure 150b (see FIG. 21) formed in the second sub-region II may be higher than the threshold voltage of the fourth gate structure 150d (see FIG. 21) formed in the fourth sub-region IV. As the amount of doped impurities increases, the threshold voltage of the transistor decreases.

A first recess 133a may be formed in the first fin F1 on both sides of the first dummy gate structure 110a, and a second recess 133b may be formed in the third fin F3 on both sides of the third dummy gate structure 110c.

Figure 19:
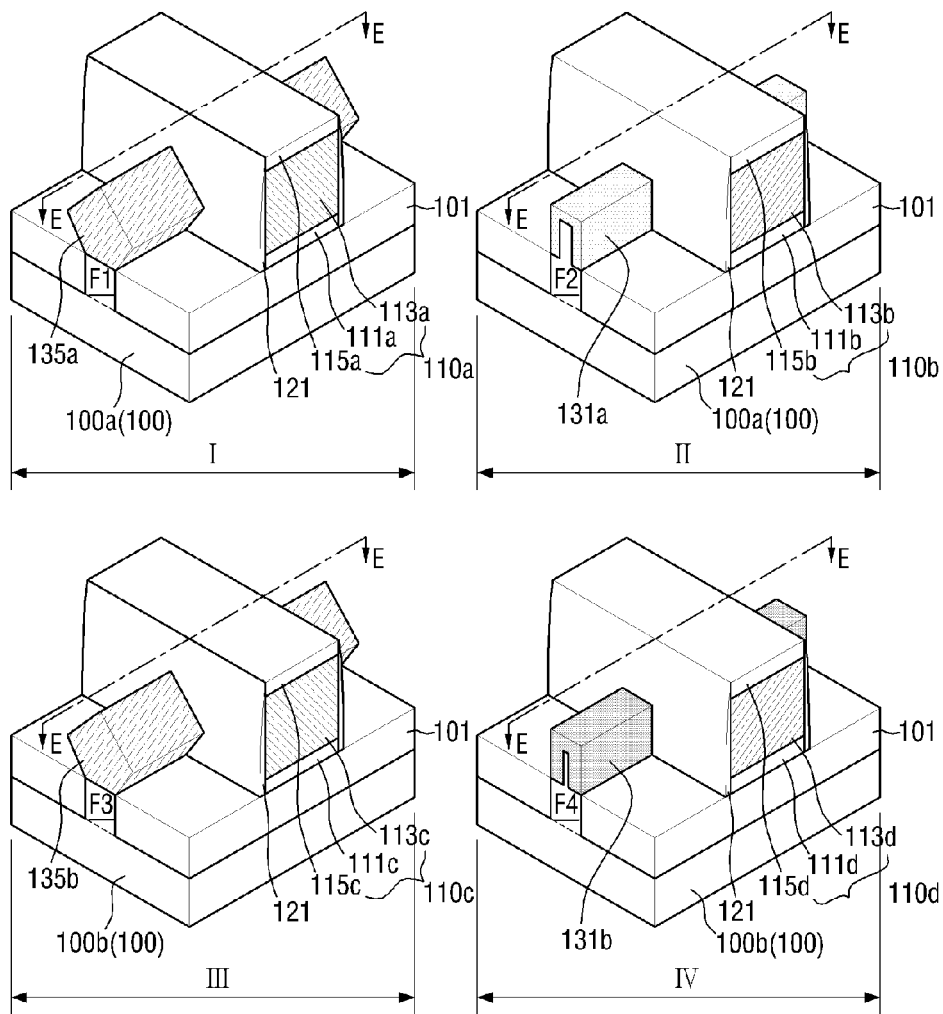

Referring to FIGS. 19 and 20, first and second source/drain regions 135a and 135b may be formed in the first and third fins F1 and F3, respectively.

The first source/drain region 135a may be formed on both sides of the first dummy gate structure 110a, and the second source/drain region 135b may be formed on both sides of the third dummy gate structure 110c The first and second source/drain regions 135a and 135b may be formed by forming an epitaxial layer in each of the first and second recesses 133a and 133b and doping impurities into the epitaxial layer. For example, the first and second source/drain regions 135a and 135b may be formed by in-situ doping of impurities (e.g., P-type impurities) while forming an epitaxial layer in each of the first and second recesses 133a and 133b by a selective epitaxial process. Alternatively, the first and second source/drain regions 135a and 135b may be formed by performing ion implantation of impurities (e.g., P-type impurities) into the epitaxial layer, or diffusing a solid source. The first and second source/drain regions 135a and 135b may include a compressive stress material. For example, the compressive stress material may be a material, for example, SiGe, having a lattice constant larger than that of Si. The compressive stress material may improve the mobility of carriers of a channel region by applying compressive stress to the first and third fins F1 and F3.

The first and second source/drain regions 135a and 135b may be elevated source/drain regions. Thus, the upper surfaces of the first and second source/drain regions 135a and 135b may be higher than the upper surfaces of the first and third fins F1 and F3. The first and second source/drain regions 135a and 135b may be in contact with the spacers 121.

In the second and fourth fins F2 and F4, the first and second doped regions 131a and 131b may be source/drain regions, respectively.

Referring to FIGS. 1 and 21 to 23, the first to fourth dummy gate structures 110a, 110b, 110c and 110d may be replaced with the first to fourth gate structures 150a, 150b, 150c and 150d, respectively (step S600).

An interlayer insulating film 141 may be formed on the resultant structure illustrated in FIG. 19. The interlayer insulating film 141 may include, for example, a silicon oxide film. The interlayer insulating film 141 may cover the first and second source/drain regions 135a and 135b, the first and second doped regions 131a and 131b, and the dummy gate structures 110a, 110b, 110c and 110d on the substrate 100.

Subsequently, the interlayer insulating film 141 may be planarized until the upper surfaces of the first to fourth dummy gate structures 110a, 110b, 110c and 110d are exposed. As a result, the first to fourth hard masks 115a, 115b, 115c and 115d may be removed to expose the upper surfaces of the first to fourth dummy gate electrodes 113a, 113b, 113c and 113d.

Then, the first to fourth dummy gate electrodes 113a, 113b, 113c and 113d and the first to fourth dummy insulating films 111a, 111b, 111c and 111d may be removed.

By removing the first to fourth dummy gate electrodes 113a, 113b, 113c and 113d and the first to fourth dummy insulating films 111a, 111b, 111c and 111d, a part of the field isolation film 101 and the first to fourth fins F1, F2, F3 and F4 may be exposed.

The first to fourth gate structures 150a, 150b, 150c and 150d may be formed in portions where the first to fourth dummy gate electrodes 113a, 113b, 113c and 113d and the first to fourth dummy insulating films 111a, 111b, 111c and 111d are removed.

Each of the first to fourth gate structures 150a, 150b, 150c and 150d may include the corresponding gate insulating film of first to fourth gate insulating films 151a, 151b, 151c and 151d, and the corresponding gate electrode of first to fourth gate electrodes 153a, 153b, 153c and 153d.

The first to fourth gate insulating films 151a, 151b, 151c and 151d may include a high dielectric constant material having a dielectric constant higher than that of a silicon oxide film. For example, the first to fourth gate insulating films 151a, 151b, 151c and 151d may include at least one material of HfSiON, $HfO_2$, $ZrO_2$, $Al_2O_3$, $Ta_2O_5$, $TiO_2$, $SrTiO_3$ and $(Ba, Sr)TiO_3$.

The first to fourth gate insulating films 151a, 151b, 151c and 151d may be formed conformally along the upper surface of the field isolation film 101 and the upper surfaces and the sidewalls of the first to fourth fins F1, F2, F3 and F4.

The first to fourth gate electrodes 153a, 153b, 153c and 153d may be formed on the first to fourth gate insulating films 151a, 151b, 151c and 151d.

The first and third gate electrodes 153a and 153c may include first work function adjusting layers 155a and 155c and gate metals 157a and 157c. The second and fourth gate electrodes 153b and 153d may include second work function adjusting layers 155b and 155d and gate metals 157b and 157d.

The first work function adjusting layers 155a and 155c may be formed on the first and third gate insulating films 151a and 151c.

The first work function adjusting layers 155a and 155c may be formed conformally along the upper surfaces and the sidewalls of the first and third fins F1 and F3. Further, the first work function adjusting layers 155a and 155c may be formed conformally along the sidewalls of the spacers 121.

The first work function adjusting layers 155a and 155c are P-type work function adjusting layers to adjust the work functions of the first and third gate structures 150a and 150c. The first work function adjusting layers 155a and 155c may include, for example, TiN.

The gate metals 157a and 157c may be formed on the first work function adjusting layers 155a and 155c. The gate metals 157a and 157c may fill spaces formed by the first work function adjusting layers 155a and 155c.

The gate metals 157a and 157c may include, for example, W or Al. Meanwhile, the first and third gate electrodes 153a and 153c may be made of Si, SiGe or the like rather than metal.

The second work function adjusting layers 155b and 155d may be formed on the second and fourth gate insulating films 151b and 151d.

The second work function adjusting layers 155b and 155d may be formed conformally along the upper surfaces and the sidewalls of the second and fourth fins F2 and F4. Further, the second work function adjusting layers 155b and 155d may be formed conformally along the sidewalls of the spacers 121.

The second work function adjusting layers 155b and 155d are N-type work function adjusting layers to adjust the work functions of the second and fourth gate structures 150b and 150d. The second work function adjusting layers 155b and 155d may include, for example, at least one of TiAl, TiAlC, TiAlN, TaC, TiC and HfSi.

The gate metals 157b and 157d may be formed on the second work function adjusting layers 155b and 155d. The gate metals 157b and 157d may fill spaces formed by the second work function adjusting layers 155b and 155d.

The gate metals 157b and 157d may include, for example, W or Al. Meanwhile, the second and fourth gate electrodes 153b and 153d may be made of Si, SiGe or the like rather than metal.

In one embodiment, the first and third gate electrodes 153a and 153c may further include the second work function adjusting layers 155b and 155d. In this case, the second work function adjusting layers 155b and 155d may be formed conformally between the first work function adjusting layers 155a and 155c and the gate metals 157a and 157c.

Although the first and third gate electrodes 153a and 153c include the second work function adjusting layers 155b and 155d, the work functions of the first and third gate structures 150a and 150c may be adjusted by the first work function adjusting layers 155a and 155c.

A method for fabricating a semiconductor device according to another embodiment will be described with reference to FIGS. 2 to 16 and 24 to 29. A repeated description will be omitted and differences will be mainly described.

FIGS. 24 to 29 are diagrams showing intermediate steps of a method for fabricating a semiconductor device according to another embodiment of the present inventive concept.

Figure 24:
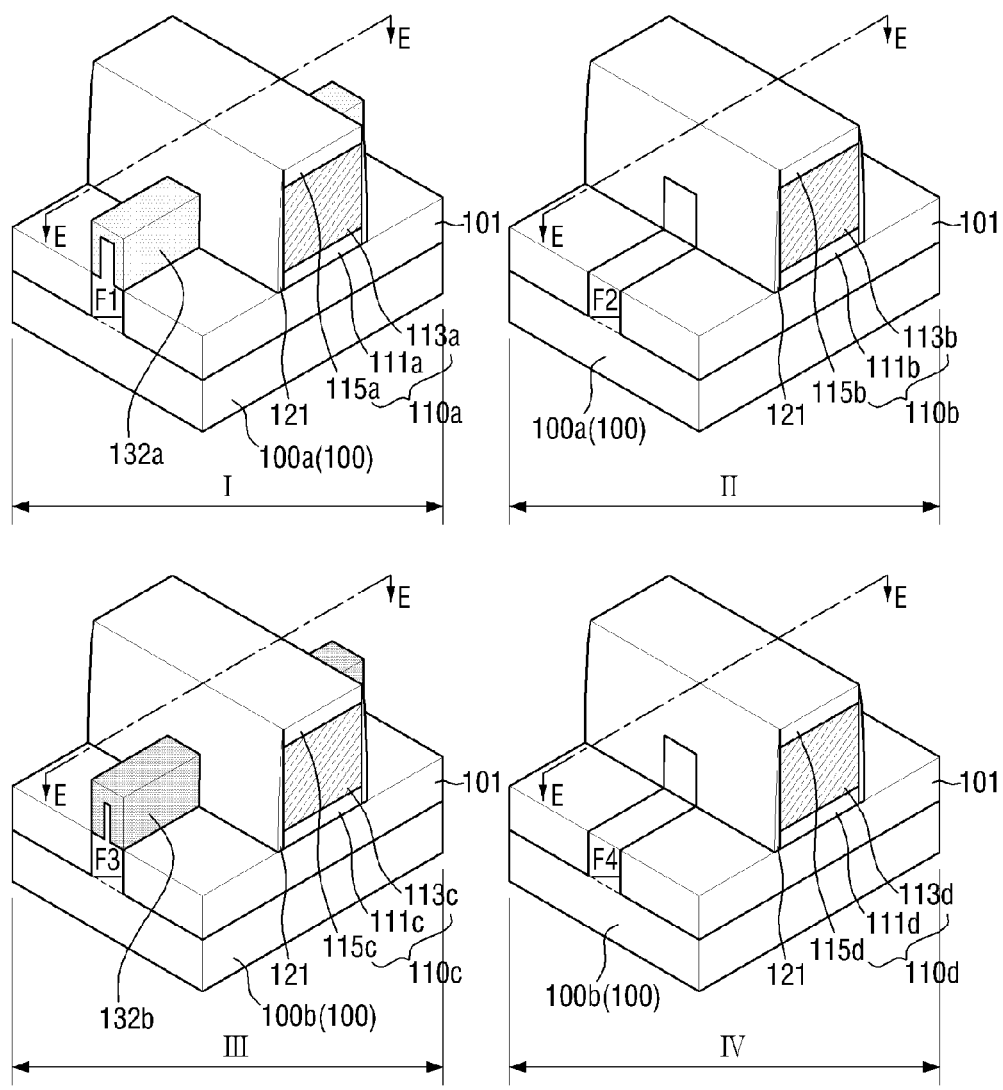
FIGS. 24 to 29 are diagrams showing intermediate steps of a method for fabricating a semiconductor device according to another embodiment of the present inventive concept.
Figure 25:
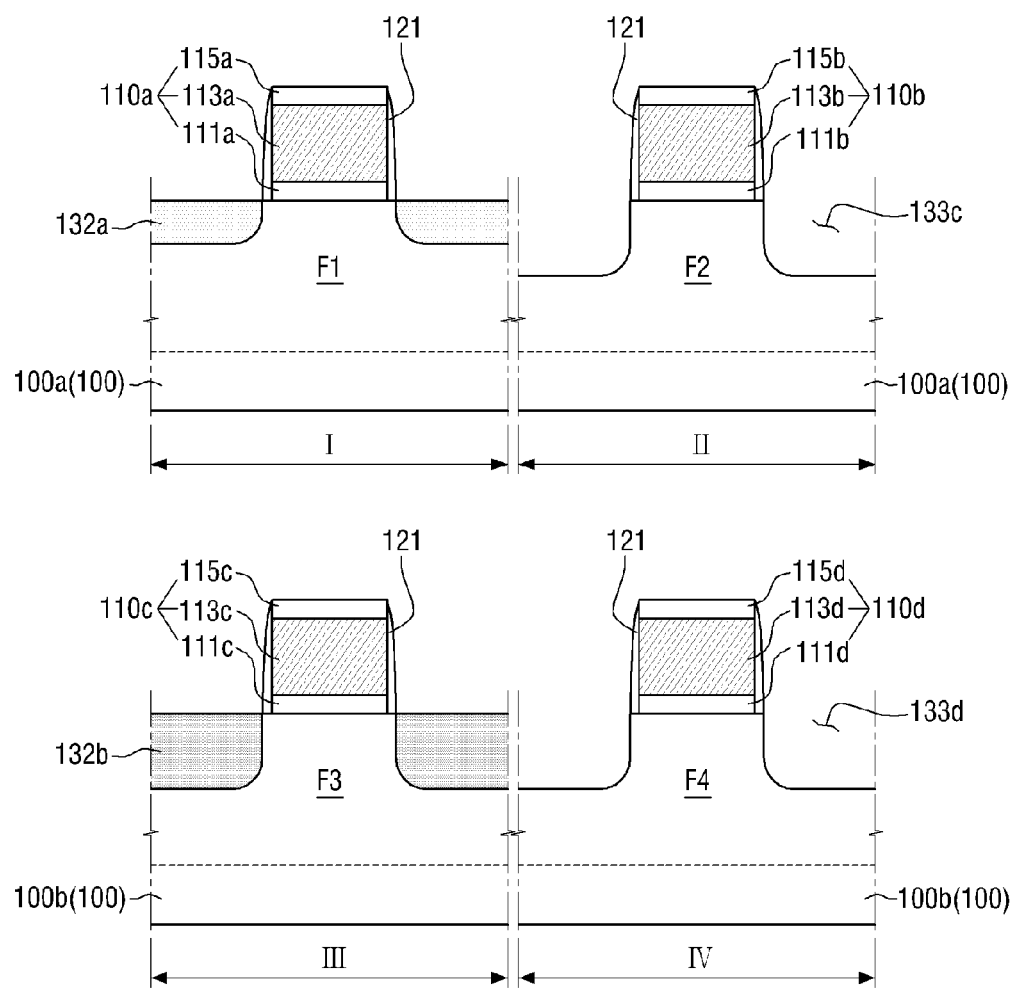
Figure 26:
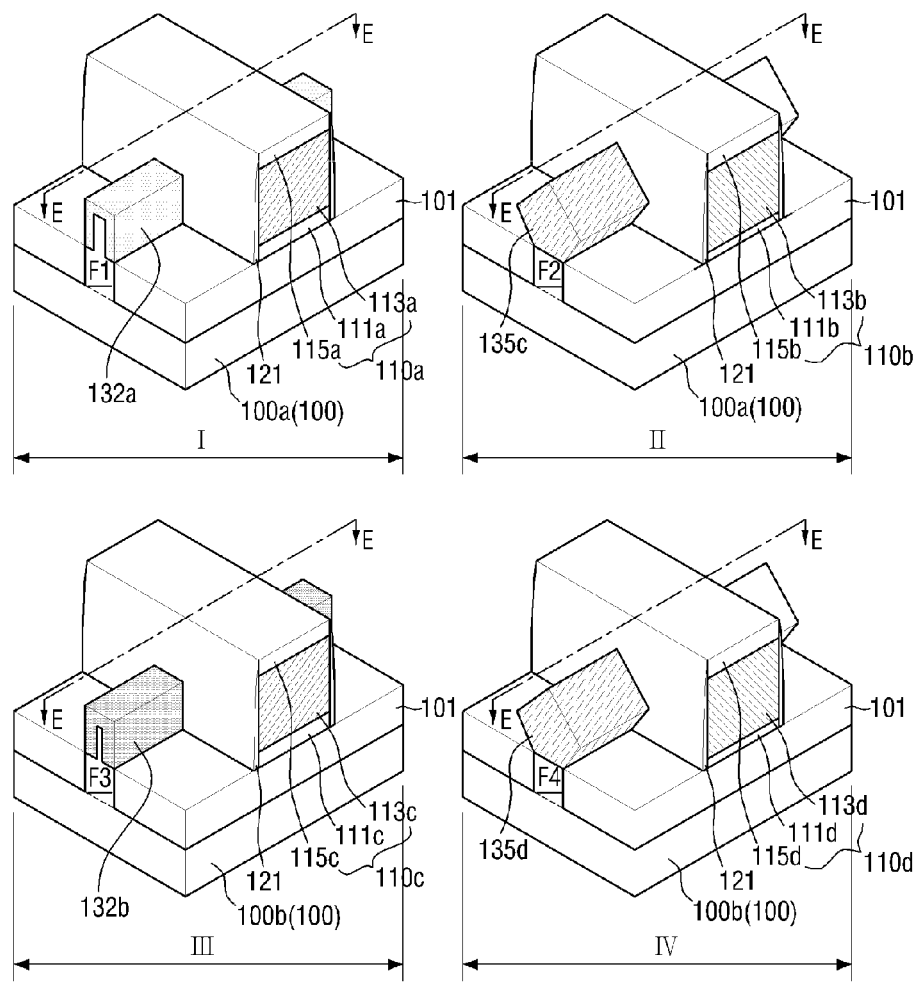
Figure 27:
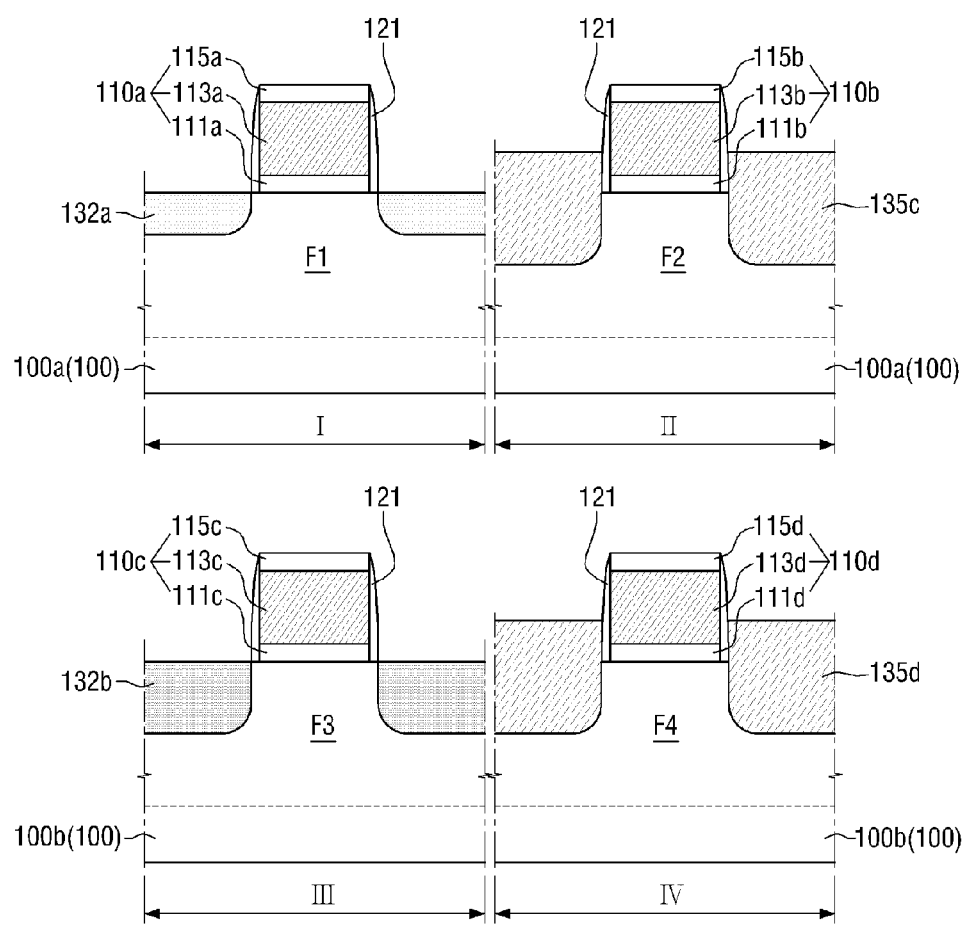
Figure 28:
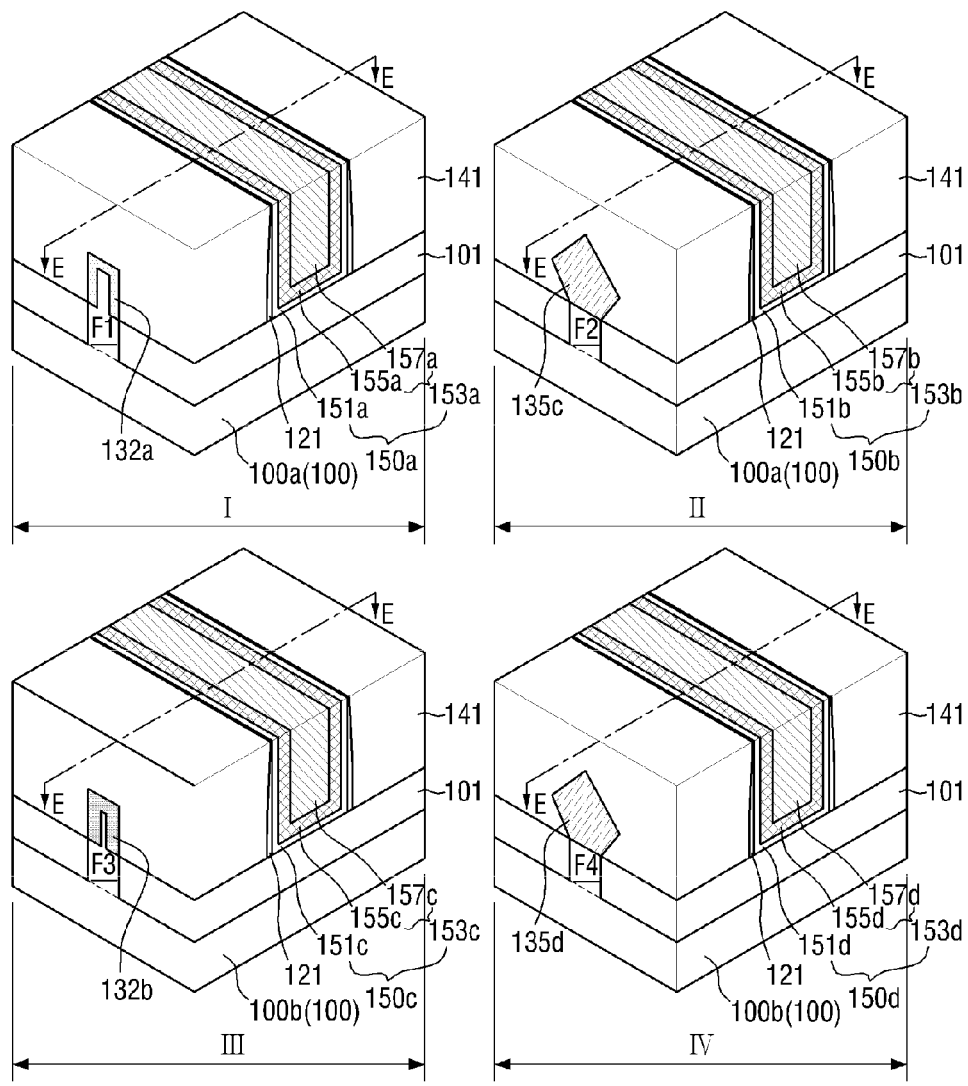
Figure 29:
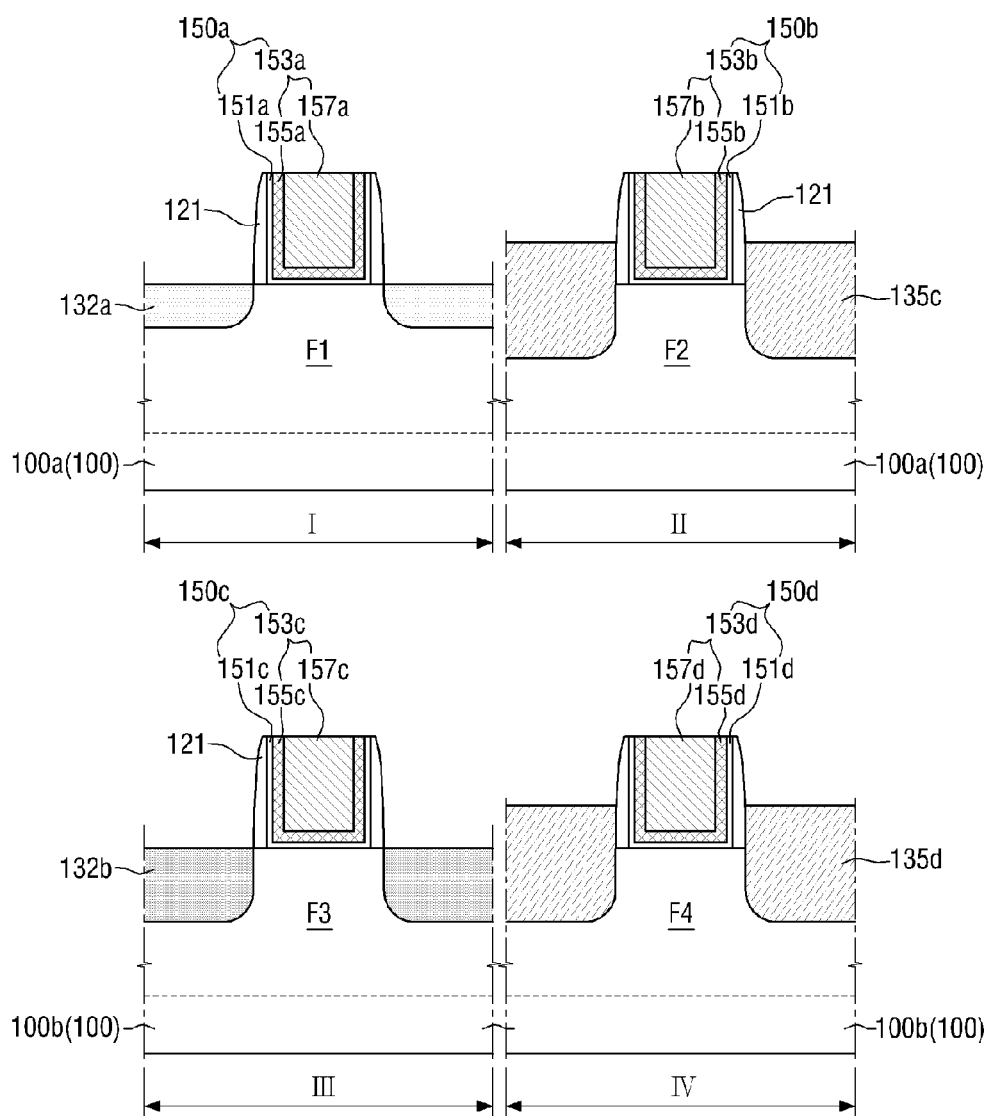

Specifically, FIGS. 24, 26 and 28 are perspective views, and FIG. 25 is a cross-sectional view taken along line E-E of FIG. 24. FIG. 27 is a cross-sectional view taken along line E-E of FIG. 26, and FIG. 29 is a cross-sectional view taken along line E-E of FIG. 28.

Since the fabricating method of FIGS. 2 to 16 is the same as the above-described description, a detailed description thereof will be omitted. However, in FIGS. 13 and 14, when the ion implantation process 125 is performed, the impurities may include P-type impurities. Thus, the impurities may be, for example, B or BF2.

Then, referring to FIGS. 24 and 25, the first and second screen films 123a and 123b may be removed. Accordingly, the first to fourth fins F1, F2, F3 and F4 on both sides of the first to fourth dummy gate structures 110a, 110b, 110c and 110d may be partially exposed.

Then, the second and fourth fins F2 and F4 of the second and fourth sub-regions II and IV may be removed. The portions of the second and fourth fins F2 and F4, which are not covered by the second and fourth dummy gate structures 110b and 110d, may be etched. A first doped region 132a of the second sub-region II and a second doped region 132b of the fourth sub-region IV may be removed.

Even if the P-type impurities are doped into the second and fourth fins F2 and F4, since the first and second doped regions 132a and 132b doped with P-type impurities are removed, the P-type impurities may not affect the performance of transistors formed in the second and fourth sub-regions II and IV.

In one embodiment, the amount of impurities doped into the first and second fins F1 and F2 of the first region 100a may be different from the amount of impurities doped into the third and fourth fins F3 and F4 of the second region 100b. Thus, the threshold voltage of the first gate structure 150a (see FIG. 28) formed in the first region 100a may be different from the threshold voltage of the third gate structure 150c (see FIG. 28) formed in the second region 100b.

For example, since the impurities are P-type impurities and the amount of impurities doped into the first sub-region I is smaller than the amount of impurities doped into the third sub-region III, the threshold voltage of the first gate structure 150a (see FIG. 28) formed in the first sub-region I may be higher than the threshold voltage of the third gate structure 150c (see FIG. 28) formed in the third sub-region III. As the amount of doped impurities increases, the threshold voltage of the transistor decreases.

A third recess 133c may be formed in the second fin F2 on both sides of the second dummy gate structure 110b, and a fourth recess 133d may be formed in the fourth fin F4 on both sides of the fourth dummy gate structure 110d.

Referring to FIGS. 26 and 27, the third source/drain region 135c may be formed in the second fin F2, and the fourth source/drain region 135d may be formed in the fourth fin F4.

The third source/drain region 135c may be formed on both sides of the second dummy gate structure 110b, and the fourth source/drain region 135d may be formed on both sides of the fourth dummy gate structure 110d. The third and fourth source/drain regions 135c and 135d may be formed by forming an epitaxial layer in each of the third and fourth recesses 133c and 133d and doping impurities into the epitaxial layer. For example, the third and fourth source/drain regions 135c and 135d may be formed by in-situ doping of impurities (e.g., N-type impurities) while forming an epitaxial layer in each of the third and fourth recesses 133c and 133d by a selective epitaxial process. Alternatively, the third and fourth source/drain regions 135c and 135d may be formed by performing ion implantation of impurities (e.g., N-type impurities) into the epitaxial layer, or diffusing a solid source.

The third and fourth source/drain regions 135c and 135d may include a tensile stress material. The third and fourth source/drain regions 135c and 135d may be made of the same material as the substrate 100, or a tensile stress material. For example, if the substrate 100 is made of Si, the third and fourth source/drain regions 135c and 135d may be made of Si, or a material (e.g., SiC, SiP) having a lattice constant smaller than that of Si. Thus, the upper surfaces of the third and fourth source/drain regions 135c and 135d may be higher than the upper surfaces of the second and fourth fins F2 and F4. The third and fourth source/drain regions 135c and 135d may be in contact with the spacers 121.

In the first and third fins F1 and F3, the first and second doped regions 132a and 132b may be source/drain regions, respectively. Referring to FIGS. 28 to 29, the first to fourth dummy gate structures 110a, 110b, 110c and 110d may be replaced with the first to fourth gate structures 150a, 150b, 150c and 150d, respectively.

First, the interlayer insulating film 141 may be formed on the resultant structure illustrated in FIG. 26. The interlayer insulating film 141 may be, for example, a silicon oxide film. The interlayer insulating film 141 may cover the third and fourth source/drain regions 135c and 135d, and the first and second doped regions 132a and 132b on the substrate 100.

Subsequently, the interlayer insulating film 141 may be planarized until the upper surfaces of the first to fourth dummy gate structures 110a, 110b, 110c and 110d are exposed. As a result, the first to fourth hard masks 115a, 115b, 115c and 115d may be removed to expose the upper surfaces of the first to fourth dummy gate electrodes 113a, 113b, 113c and 113d.

Then, the first to fourth dummy gate electrodes 113a, 113b, 113c and 113d and the first to fourth dummy insulating films 111a, 111b, 111c and 111d may be removed to form the first to fourth gate structures 150a, 150b, 150c and 150d.

By removing the first to fourth dummy gate electrodes 113a, 113b, 113c and 113d and the first to fourth dummy insulating films 111a, 111b, 111c and 111d, a part of the field isolation film 101 and the first to fourth fins F1, F2, F3 and F4 may be exposed.

The first to fourth gate structures 150a, 150b, 150c and 150d may be formed in portions where the first to fourth dummy gate electrodes 113a, 113b, 113c and 113d and the first to fourth dummy insulating films 111a, 111b, 111c and 111d are removed.

The first to fourth gate structures 150a, 150b, 150c and 150d may include the first to fourth gate insulating films 151a, 151b, 151c and 151d, and the first to fourth gate electrodes 153a, 153b, 153c and 153d.

The first to fourth gate insulating films 151a, 151b, 151c and 151d may include a high dielectric constant material having a dielectric constant higher than that of a silicon oxide film. For example, the first to fourth gate insulating films 151a, 151b, 151c and 151d may include at least one material of HfSiON, $HfO_2$, $ZrO_2$, $Al_2O_3$, $Ta_2O_5$, $TiO_2$, $SrTiO_3$ and $(Ba, Sr)TiO_3$.

The first to fourth gate insulating films 151a, 151b, 151c and 151d may be formed conformally along the upper surface of the field isolation film 101 and the upper surfaces and the sidewalls of the first to fourth fins F1, F2, F3 and F4.

The first to fourth gate electrodes 153a, 153b, 153c and 153d may be formed on the first to fourth gate insulating films 151a, 151b, 151c and 151d. The first and third gate electrodes 153a and 153c may include first work function adjusting layers 155a and 155c and gate metals 157a and 157c. The second and fourth gate electrodes 153b and 153d may include second work function adjusting layers 155b and 155d and gate metals 157b and 157d.

The first work function adjusting layers 155a and 155c may be formed on the first and third gate insulating films 151a and 151c.

The first work function adjusting layers 155a and 155c may be formed conformally along the upper surfaces and the sidewalls of the first and third fins F1 and F3. Further, the first work function adjusting layers 155a and 155c may be formed conformally along the upper surfaces of the first and third fins F1 and F3 and the sidewalls of the spacers 121.

The first work function adjusting layers 155a and 155c are P-type work function adjusting layers to adjust the work functions of the first and third gate structures 150a and 150c. The first work function adjusting layers 155a and 155c may include, for example, TiN.

The gate metals 157a and 157c may be formed on the first work function adjusting layers 155a and 155c. The gate metals 157a and 157c may fill spaces formed by the first work function adjusting layers 155a and 155c.

The gate metals 157a and 157c may include, for example, W or Al. The first and third gate electrodes 153a and 153c may be made of Si, SiGe or the like rather than metal.

The second work function adjusting layers 155b and 155d may be formed on the second and fourth gate insulating films 151b and 151d.

The second work function adjusting layers 155b and 155d may be formed conformally along the upper surfaces and the sidewalls of the second and fourth fins F2 and F4. Further, the second work function adjusting layers 155b and 155d may be formed conformally along the upper surfaces of the second and fourth fins F2 and F4 and the sidewalls of the spacers 121.

The second work function adjusting layers 155b and 155d are N-type work function adjusting layers to adjust the work functions of the second and fourth gate structures 150b and 150d. The second work function adjusting layers 155b and 155d may include, for example, at least one of TiAl, TiAlC, TiAlN, TaC, TiC and HfSi.

The gate metals 157b and 157d may be formed on the second work function adjusting layers 155b and 155d. The gate metals 157b and 157d may fill spaces formed by the second work function adjusting layers 155b and 155d.

The gate metals 157b and 157d may include, for example, W or Al. The second and fourth gate electrodes 153b and 153d may be made of Si, SiGe or the like rather than metal.

In one embodiment, the first and third gate electrodes 153a and 153c may further include the second work function adjusting layers 155b and 155d. In this case, the second work function adjusting layers 155b and 155d may be formed conformally between the first work function adjusting layers 155a and 155c and the gate metals 157a and 157c.

Although the first and third gate electrodes 153a and 153c include the second work function adjusting layers 155b and 155d, the work functions of the first and third gate structures 150a and 150c may be adjusted by the first work function adjusting layers 155a and 155c.

Figure 30:
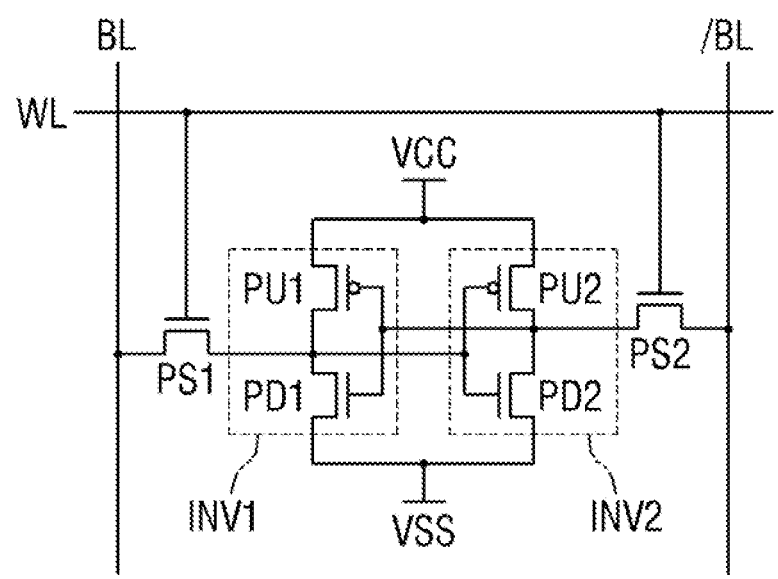
FIGS. 30 and 31 are a circuit diagram and a layout diagram for explaining a semiconductor device fabricated according to some embodiments of the present inventive concept.
Figure 31:
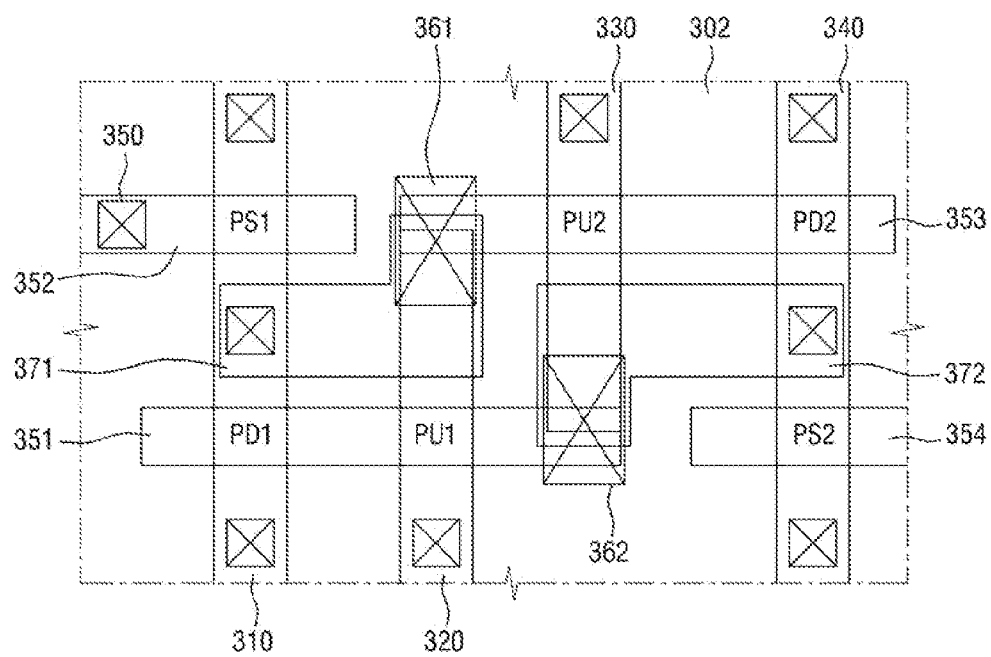

FIGS. 30 and 31 are a circuit diagram and a layout diagram for explaining a semiconductor device including a fin-type transistor fabricated according to an embodiment of the present inventive concept.

As used herein, a semiconductor device may refer to any of the various devices such as shown in FIGS. 1-29, 30, and/or 31, and may also refer, for example, to one or more transistors or a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, a hard drive including additional components, or a mobile phone, laptop, tablet, desktop, camera, or other consumer electronic device, etc.

FIGS. 30 and 31 exemplarily illustrate an SRAM, but the fin-type transistor fabricated according to the embodiment of the present inventive concept may also be applied to other semiconductor devices.

First, referring to FIG. 30, the semiconductor device may include a pair of inverters INV1 and INV2 connected in parallel between a power supply node Vcc and a ground node Vss, and a first pass transistor PS1 and a second pass transistor PS2 connected to output nodes of the inverters INV1 and INV2, respectively. The first pass transistor PS1 and the second pass transistor PS2 may be connected to a bit line BL and a complementary bit line BL/, respectively. The gates of the first pass transistor PS1 and the second pass transistor PS2 may be connected to a word line WL.

The first inverter INV1 includes a first pull-up transistor PU1 and a first pull-down transistor PD1 connected in series. The second inverter INV2 includes a second pull-up transistor PU2 and a second pull-down transistor PD2 connected in series. The first pull-up transistor PU1 and the second pull-up transistor PU2 may be PMOS transistors, and the first pull-down transistor PD1 and the second pull-down transistor PD2 may be NMOS transistors.

Further, the first inverter INV1 and the second inverter INV2 are configured such that the input node of the first inverter INV1 is connected to the output node of the second inverter INV2, and the input node of the second inverter INV2 is connected to the output node of the first inverter INV1 to constitute one latch circuit.

In this case, referring to FIGS. 30 and 31, a first fin 310, a second fin 320, a third fin 330 and a fourth fin 340, which are spaced apart from one another, are formed to be elongated in one direction. The extending lengths of the second fin 320 and the third fin 330 may be shorter than the extending lengths of the first fin 310 and the fourth fin 340.

Further, a first gate electrode 351, a second gate electrode 352, a third gate electrode 353 and a fourth gate electrode 354 are elongated in the other direction intersecting the fins 310, 320, 330 and 340, and formed to intersect the first fin 310 to the fourth fin 340. Specifically, the first gate electrode 351 may partially overlap with an end portion of the third fin 330 while completely intersecting the first fin 310 and the second fin 320. The third gate electrode 353 may partially overlap with an end portion of the second fin 320 while completely intersecting the fourth fin 340 and the third fin 330. The second gate electrode 352 and the fourth gate electrode 354 are formed to intersect the first fin 310 and the fourth fin 340, respectively.

As illustrated, the first pull-up transistor PU1 is formed at the intersection of the first gate electrode 351 and the second fin 320. The first pull-down transistor PD1 is formed at the intersection of the first gate electrode 351 and the first fin 310. The first pass transistor PS1 is formed at the intersection of the second gate electrode 352 and the first fin 310. The second pull-up transistor PU2 is formed at the intersection of the third gate electrode 353 and the third fin 330. The second pull-down transistor PD2 is formed at the intersection of the third gate electrode 353 and the fourth fin 340. The second pass transistor PS2 is formed at the intersection of the fourth gate electrode 354 and the fourth fin 340.

Although not clearly shown, recesses may be formed on both sides of the intersections of the first to fourth gate electrodes 351 to 354 and the first to fourth fins 310, 320, 330 and 340, and source/drain may be formed in each recess.

Further, a plurality of contacts 350 may be formed.

In addition, in one embodiment, a first shared contact 361 simultaneously connects the second fin 320, the third gate electrode 353 and a wiring 371. A second shared contact 362 simultaneously connects the third fin 330, the first gate electrode 351 and a wiring 372.

In one embodiment, all of the first pull-up transistor PU1, the first pull-down transistor PD1, the first pass transistor PS1, the second pull-up transistor PU2, the second pull-down transistor PD2, and the second pass transistor PS2 are fin-type transistors, and may be formed by a method for fabricating a semiconductor device according to embodiments described above.

Figure 32:
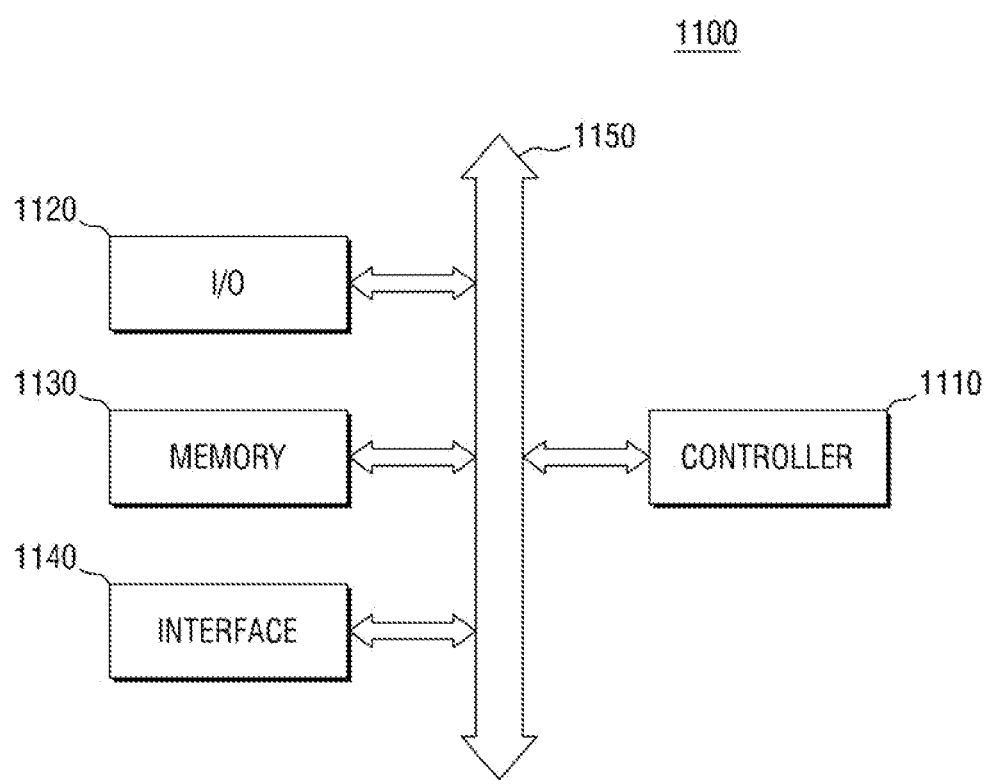
FIG. 32 is a block diagram of an electronic system including a semiconductor device fabricated according to some embodiments of the present inventive concept.

FIG. 32 is a block diagram of an electronic system including a semiconductor device fabricated according to one or more embodiments of the present inventive concept.

Referring to FIG. 32, an electronic system 1100 according to one embodiment of the present inventive concept may include a controller 1110, an input/output (I/O) device 1120, a memory device 1130, an interface 1140, and a bus 1150. The controller 1110, the I/O device 1120, the memory device 1130, and/or the interface 1140 may be connected to each other through the bus 1150. The bus 1150 corresponds to a path through which data are transferred.

The controller 1110 may include at least one of a microprocessor, a digital signal processor, a micro-controller and other logic devices performing similar functions. The I/O device 1120 may comprise a keypad, a keyboard, a display device and the like. The memory device 1130 may store data and/or commands. The interface 1140 may serve to transmit/receive data to/from a communication network. The interface 1140 may be of a wired or wireless type. For example, the interface 1140 may include an antenna, a wired/wireless transceiver or the like. Although not shown in the drawings, the electronic system 1100 may further include a high-speed DRAM and/or SRAM as an operating memory for improving the operation of the controller 1110. The semiconductor device fabricated according to the embodiments of the present inventive concept may be provided in the memory device 1130, or may be provided as a part of the controller 1110, the I/O device 1120 and the like.

The electronic system 1100 may be applied to an electronic device, such as a personal digital assistant (PDA), a portable computer, a web tablet, a wireless phone, a mobile phone, a digital music player, a memory card, or various electronic products capable of transmitting and/or receiving information in a wireless environment.

While the present disclosure has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A method for fabricating a semiconductor device, comprising:
providing a substrate including a first region and a second region, the first region including first and second sub-regions, and the second region including third and fourth sub-regions, wherein the first and third sub-regions include PMOS regions, and the second and fourth sub-regions include NMOS regions;
forming first to fourth fins on the first and second regions to protrude from the substrate, the first fin being formed on the first sub-region, the second fin being formed on the second sub-region, the third fin being formed on the third sub-region, and the fourth fin being formed on the fourth sub-region;
forming first to fourth dummy gate structures to intersect the first to fourth fins, the first dummy gate structure being formed on the first fin, the second dummy gate structure being formed on the second fin, the third dummy gate structure being formed on the third fin, and the fourth dummy gate structure being formed on the fourth fin;
forming a first doped region in each of the first and second fins and a second doped region in each of the third and fourth fins by doping impurities into the first to fourth fins on both sides of the first to fourth dummy gate structures by performing an ion implantation process simultaneously in the first and second regions without a mask; and
removing the first doped region of the first fin and the second doped region of the third fin, or removing the first doped region of the second fin and the second doped region of the fourth fin.

2. The method of claim 1, further comprising:
before doping the impurities, forming a first screen film to cover the first and second fins and a second screen film to cover the third and fourth fins; and
removing the first and second screen films after doping the impurities.

3. The method of claim 2, wherein a first thickness of the first screen film is different from a second thickness of the second screen film.

4. The method of claim 3, wherein the first thickness is larger than the second thickness, and the amount of impurities of the first doped region is smaller than the amount of impurities of the second doped region.

5. The method of claim 3, wherein a thickness of the first doped region is smaller than a thickness of the second doped region.

6. The method of claim 2, wherein the removing the first doped region of the first fin and the second doped region of the third fin comprises, after removing the first and second screen films, forming first and second recesses, respectively, by etching the first fin on both sides of the first dummy gate structure and the third fin on both sides of the third dummy gate structure.

7. The method of claim 6, further comprising:
forming first and second source/drain regions, respectively, in the first and second recesses through epitaxial growth; and
replacing the first to fourth dummy gate structures with first to fourth gate structures.

8. The method of claim 1, wherein the ion implantation process includes an angled ion implantation process.

9. A method for fabricating a semiconductor device, comprising:
providing a substrate including an NMOS region and a PMOS region;
forming first and second fins on the NMOS region and the PMOS region to protrude from the substrate;
forming a first doped region in the first fin and a second doped region in the second fin by doping impurities into the first and second fins simultaneously by an angled ion implantation process without a mask;
removing the first doped region or the second doped region; and
forming source/drain regions in the removed portion by epitaxial growth.

10. The method of claim 9, further comprising:
before forming the first and second doped regions, forming a first dummy gate structure to intersect the first fin and a second dummy gate structure to intersect the second fin, wherein the first doped region is formed on both sides of the first dummy gate structure, and the second doped region is formed on both sides of the second dummy gate structure.

11. The method of claim 9, further comprising:
before forming the first and second doped regions, forming a screen film to cover the first and second fins.

12. A method for fabricating a semiconductor device, comprising:
providing a substrate including a first region and a second region, the first region including first and second sub-regions, and the second region including third and fourth sub-regions, wherein the first and third sub-regions include PMOS regions and the second and fourth sub-regions include NMOS regions;
forming first to fourth fins on the first and second regions to protrude from the substrate, the first fins being formed on the first sub-region, the second fins being formed on the second sub-region, the third fins being formed on the third sub-region, and the fourth fins being formed on the fourth sub-region;
forming first to fourth dummy gate structures to intersect the first to fourth fins, the first dummy gate structure being formed on the first fins, the second dummy gate structure being formed on the second fins, the third dummy gate structure being formed on the third fins, and the fourth dummy gate structure being formed on the fourth fins;
forming a first screen film on the first region, the first screen film having a first thickness;
forming a second screen film on the second region, the second screen film having a second thickness smaller than the first thickness; and
forming first doped regions in the first and second fins of the first region and second doped regions in the third and the fourth fins of the second region by simultaneously doping impurities into the first to fourth fins, wherein the simultaneous doping is performed as an obliquely angled doping process with respect to a perpendicular line extending from the surface of the substrate.

13. The method of claim 12, further comprising:
removing the first doped region of the first fins and the second doped region of the third fins, or removing the first doped region of the second fins and the second doped regions of the fourth fin.

14. The method of claim 12, further comprising:
removing the first and second screen films, wherein the first screen film covers the first and second fins and the second screen film covers the third and fourth fins.

15. The method of claim 12, wherein the amount of impurities of the first doped region is smaller than the amount of impurities of the second doped region.

16. The method of claim 12, further comprising:
before forming the first and second doped regions, forming a first dummy gate structure to intersect the first fin and a second dummy gate structure to intersect the second fin,
wherein the first doped region is formed on both sides of the first dummy gate structure, and the second doped region is formed on both sides of the second dummy gate structure.

17. The method of claim 14, further comprising:
after removing the first and second screen films, forming first and second recesses, respectively, by etching the first fins on both sides of the first dummy gate structure and the third fins on both sides of the third dummy gate structure.

18. The method of claim 15, further comprising:
forming first and second source/drain regions, respectively, in the first and second recesses through epitaxial growth; and
replacing the first to fourth dummy gate structures with first to fourth gate structures.

19. The method of claim 2, wherein the removing the first doped region of the second fin and the second doped region of the fourth fin comprises, after removing the first and second screen films, forming third and fourth recesses, respectively, by etching the second fin on both sides of the second dummy gate structure and the fourth fin on both sides of the fourth dummy gate structure.

20. The method of claim 19, further comprising:
forming third and fourth source/drain regions, respectively, in the third and fourth recesses through epitaxial growth; and
replacing the first to fourth dummy gate structures with first to fourth gate structures.

* * * * *